(12) United States Patent
Matsuzawa et al.

(10) Patent No.: US 10,382,051 B2
(45) Date of Patent: Aug. 13, 2019

(54) TIME DOMAIN A/D CONVERTER GROUP AND SENSOR DEVICE USING THE SAME

(71) Applicant: TECH IDEA CO., LTD., Kanagawa (JP)

(72) Inventors: Akira Matsuzawa, Kanagawa (JP); Masaya Nohara, Ibaraki (JP)

(73) Assignee: TECH IDEA CO., LTD., Kanagawa (JP)

( * ) Notice: Subject to any disclaimer, the term of this patent is extended or adjusted under 35 U.S.C. 154(b) by 0 days.

(21) Appl. No.: 16/194,844

(22) Filed: Nov. 19, 2018

(65) Prior Publication Data

US 2019/0109599 A1    Apr. 11, 2019

Related U.S. Application Data

(63) Continuation of application No. 16/193,748, filed on Nov. 16, 2018, which is a continuation of application No. PCT/JP2018/028506, filed on Jul. 30, 2018.

(30) Foreign Application Priority Data

Oct. 11, 2017    (JP) .................................. 2017-198051

(51) Int. Cl.
*H03M 1/12*    (2006.01)
*H03M 1/34*    (2006.01)
(Continued)

(52) U.S. Cl.
CPC .......... *H03M 1/121* (2013.01); *H03L 7/0812* (2013.01); *H03M 1/123* (2013.01);
(Continued)

(58) Field of Classification Search
CPC .......... H03M 1/121; H03M 1/34; H03M 1/56; H03M 1/58; H03L 7/0812;
(Continued)

(56) References Cited

U.S. PATENT DOCUMENTS 7,859,583 B2 * 12/2010 Kawaguchi ............. G06F 3/044
                                                    348/294
8,284,285 B2   10/2012 Takahashi
(Continued)

FOREIGN PATENT DOCUMENTS

JP    2008-092091 A    4/2008
JP    2011-160318 A    8/2011
(Continued)

OTHER PUBLICATIONS

IEEE Journal of Solid-State Circuits, "8.3 M-Pixel 480-fps Global-Shutter CMOS Image Sensor with Gain-Adaptive Column ADCs and Chip-on-Chip Stacked Integration", vol. 52, No. 4, pp. 985-993, (Apr. 2017) .

(Continued)

*Primary Examiner* — Khai M Nguyen
(74) *Attorney, Agent, or Firm* — The Marbury Law Group, PLLC

(57) ABSTRACT

A time domain A/D converter group includes a plurality of individual A/D converters, each of the individual A/D converters is connected to a reference signal generation circuit to generate a first reference signal for sweeping in a full scale range and a second reference signal for repeating plurality of times to sweep in a limited voltage range, and each of the individual A/D converters includes a reference voltage selection circuit for switching the first reference signal or the second reference signal, a comparator for comparing an input signal with the first reference signal or the second reference signal, for generating a comparison output signal, an internal A/D converter for performing an A/D conversion using the comparison output signal from the comparator, and an accumulation adder-subtractor for outputting an average signal of A/D conversion values obtained (Continued)

from the A/D conversion when the second reference signal is selected.

4 Claims, 27 Drawing Sheets

(51) Int. Cl.
  *H03L 7/081* (2006.01)
  *H03M 1/56* (2006.01)
  *H04N 5/378* (2011.01)
  *H04N 5/3745* (2011.01)
(52) U.S. Cl.
  CPC ........... H03M 1/1295 (2013.01); H03M 1/34 (2013.01); H03M 1/56 (2013.01); *H04N 5/378* (2013.01); *H04N 5/37455* (2013.01)
(58) Field of Classification Search
  CPC .. H04N 5/37455; H04N 5/378; H04N 5/3745; H04N 5/3765
  USPC ..... 341/155, 158, 164, 169, 170; 348/222.1, 348/294, 308
  See application file for complete search history.

(56) References Cited

U.S. PATENT DOCUMENTS

| | | | |
|---|---|---|---|
| 8,456,554 B2* | 6/2013 | Takahashi | H03M 1/14 250/208.1 |
| 8,922,668 B2 | 12/2014 | Ota | |
| 8,941,045 B2 | 1/2015 | Okura et al. | |
| 9,204,070 B2 | 12/2015 | Takahashi et al. | |
| 9,571,113 B2* | 2/2017 | Ikebe | H03M 1/14 |
| 9,596,422 B2 | 3/2017 | Kato et al. | |
| 9,960,783 B2 | 5/2018 | Yeh et al. | |
| 2016/0351130 A1 | 12/2016 | Kikuchi et al. | |

FOREIGN PATENT DOCUMENTS

| | | |
|---|---|---|
| JP | 2011-254246 A | 12/2011 |
| JP | 2013-229708 A | 11/2013 |
| JP | 2015-152699 A | 8/2015 |
| JP | 2017-046318 A | 3/2017 |
| WO | 2015/008634 A1 | 1/2015 |

OTHER PUBLICATIONS

IEICE Electronics Express, Kawai, et al., "Effectiveness of a correlated multiple sampling differential average for reducing 1/f noise", vol. 2, No. 13, 379-383, (2005).
International Search Report dated Oct. 16, 2018 for the PCT application No. PCT/JP2018/028506.
Written Opinion of the ISA dated Oct. 16, 2018 for the PCT application No. PCT/JP2018/028506.
English language translation of International Search Report dated Oct. 16, 2018 for related PCT Application No. PCT/JP2018/028506.

* cited by examiner

TIME DOMAIN A/D CONVERTER GROUP AND SENSOR DEVICE USING THE SAME

CROSS REFERENCE TO RELATED APPLICATIONS

This application is a continuation of U.S. application Ser. No. 16/193,748 filed on Nov. 16, 2018, which is a continuation (bypass route) of PCT International Patent Application No. PCT/JP2018/028506, filed on Jul. 30, 2018, which claims the benefit of priority to Japanese Patent Application No. 2017-198051, filed on Oct. 11, 2017, the entire contents of all of which are incorporated herein by reference.

FIELD

The present invention relates to a time domain A/D converter and a sensor device using the same. More specifically, the present invention relates to a time domain A/D converter having a means for determination of input signal level, at least one reference signal generation circuit of a plurality of reference signal generation circuits generating a reference signal capable of converting a full-scale input signal and another of the remaining reference voltage generation circuits generating a reference signal which cyclically sweeps a limited voltage range a plurality of times, to perform an averaging process. Alternatively, it relates to a time domain A/D converter having a delay locked loop circuit which outputs a multiphase clock with different timings acquired by dividing the period of the master clock, and performing A/D conversion by using the multiphase clock. Furthermore, the present invention relates to a sensor device having the above-structured time domain A/D converter to achieve high accuracy, high speed, and low power consumption.

BACKGROUND (Conventional Sensor Device)

FIG. 21 shows a conventional sensor device 300. The sensor device 300 has a sensor region 110 with unit sensors 111 arranged in a matrix with rows and columns which detect a signal in the nature (sensed signal) and convert this signal into an electric signal. The unit sensors 111 are connected to row selection lines 112 and column selection lines 113. A vertical (row) operation circuit 130 supplies a predetermined voltage to one of the row selection lines 112 to select a row of the sensor region 110. The column selection lines 113 are connected to an A/D converting unit 120. The A/D converting unit 120 includes an A/D converter column 122 configured with a plurality of A/D converters arranged in columns. Furthermore, as required, a subtraction amplifier circuit 121 may be inserted between the column selection lines 113 and the A/D converter columns 122. An A/D horizontal (column) operation circuit 150 sequentially selects each column output of the A/D converter columns 122 for transfer to a data output terminal 151 for output. In synchronization with a clock signal supplied to a clock input terminal 141 from a clock supply circuit (not shown), a timing control circuit 140 generates a pulse signal for controlling each of the vertical (row) operation circuit 130 and the horizontal (column) operation circuit 150.

In synchronization with the clock input, a pulse signal is generated at the timing control circuit 140. With a row control signal generated at the vertical (row) operation circuit 130 in synchronization with the pulse signal, one row selection line 112 is activated, and an electric signal of the unit sensor 111 on the target row is taken out to the column selection line 113. Each column signal line is subjected to A/D conversion at the A/D converting unit 120. The A/D converting unit 120 may take a structure in which the subtraction amplifier circuit 121 and the A/D converter column 122 with unit A/D converters arranged in columns. An output signal from the A/D converting unit 120 is taken out from the data output terminal 151 with a control signal generated at the horizontal (column) operation circuit 150.

(Universal Sensor Read Circuit)

The sensor requires a read circuit 160. FIG. 22 shows an universal sensor read circuit 160. A signal from the sensor is represented as a voltage source or current source. For example, a resistive pressure sensor using a resistance change by pressure or the like can detect a change in pressure as a change in voltage occurring at a resistor by letting current flow through the resistor body. Also, a capacitive pressure sensor using a capacitance change by pressure or the like can detect a change in pressure as a change in the amount of charge by a capacitor. The change in the amount of charge can be detected as a change in voltage by using a certain capacitor.

The universal sensor read circuit 160 of FIG. 22 has a sensor 161 (represented as a voltage source) connected to a power supply voltage $V_{DD}$ and one end of a transistor $M_1$. A signal S/H (sample/hold) is supplied to the gate of the transistor $M_1$. A holding capacitor 162 is connected to the other end of the transistor $M_1$. A transistor $M_4$ is connected between the power supply voltage $V_{DD}$ and the holding capacitor 162. A signal RST is supplied to the gate of the transistor $M_4$. The holding capacitor 162 is further connected to the gate of a transistor $M_2$. One end of the transistor $M_2$ is connected to the power supply voltage $V_{DD}$, and the other end thereof is connected to one end of a transistor $M_3$. A signal SEL is supplied to the gate of the transistor $M_3$, and the other end is connected to a column current source 163. A read voltage $V_R$ appears at the other end of the transistor $M_3$.

In FIG. 22, by controlling the gate of the transistor $M_1$ with the signal S/H (sample/hold), the voltage $V_S$ of the sensor 161 is sampled and held in the holding capacitor 162. This held voltage is buffered at the transistor $M_2$ forming a source follower, and the gate of the transistor $M_3$ forming a switch is controlled with the row control signal SEL, thereby allowing the voltage to be taken out to the column signal line. The column current source 163 is provided to give a bias current required for the operation of the transistor $M_2$ forming a source follower. In the circuits of FIG. 21, circuits other than the column current source 163 are included in each unit sensor 111 and are arranged in a matrix. On the other hand, the column current source 163 is connected to the column selection line 113 for each column.

In this read circuit 160, a gate-source voltage $V_{GS}$ of the transistor is varied due to variations of a threshold voltage $V_T$ of the transistor $M_2$ configuring a source follower, and thus the signal source voltage $V_S$ cannot be accurately read. Thus, generally, a reference voltage $V_{REF}$ is first sent from a reference voltage generation circuit (not shown), the voltage $V_S$ including the signal is sent next, and a difference between these two voltages is taken, thereby allowing accurate reading of the signal source voltage $V_S$. By using this correlated double sampling, variations of the gate-source voltage $V_{GS}$ can be cancelled. Also, influences of 1/f noise of the transistor can be suppressed. As a matter of course, the voltage $V_S$ including the signal may be sent first and then the reference voltage $V_{REF}$ may be sent next.

(Slope A/D Converter)

An output from the sensor read circuit 160 is converted from an analog signal to a digital signal at the A/D converting unit 120. FIG. 23 shows a slope A/D converter 170, which is one of the time domain A/D converters often used in a CMOS image sensor as a typical sensor device, and FIG. 24 shows a relation between the input signal and reference voltage.

The slope A/D converter 170 includes a plurality of unit A/D converters 171 and a ramp wave generator 172 provided in common. Each of the plurality of unit A/D converters 171 includes a comparator 173 and a counter 174. A ramp wave signal line 177 and a clock signal line 176 are provided in common to the plurality of unit A/D converters 171. An output from the ramp wave generator 172 is supplied to the ramp wave signal line 177.

With a ramp wave control signal supplied from $V_{RT}$ to a ramp wave control signal input terminal 179 as a trigger, the ramp wave generator 172 generates a ramp wave 190 with its voltage falling in proportion to time. The counter 174 configuring the unit A/D converter 171 starts counting of clock pulses supplied to the clock signal line 176. The comparator 173 compares an input signal supplied to an input terminal 178 and a reference signal, which is a ramp wave 190 generated at the ramp wave generator 172. When the reference signal is lower than the input signal ($T_{in}$), the comparator 173 generates a flag and stops the counter 174. The counter value at that time represents the input signal voltage $V_{in}$, and thus this value is taken out at a conversion output terminal 180 as a conversion output, and the counter 174 is reset with a reset signal supplied to a reset terminal 181.

This slope A/D converter has a simple structure, a small differential non-linearity error, compensated monotonicity, and high robustness. Therefore, the slope A/D converter is widely used in a CMOS image sensor.

On the other hand, the slope A/D converter has also many problems. An example of the problems is a tradeoff between conversion speed and resolution. Thus, when a time usable for conversion is $T_{FS}$, a clock frequency $f_{cl}n$, in an A/D converter with a resolution of N bits is represented as follows.

$$f_{clk}=2^N/T_{FS} \quad (1)$$

It is assumed that the number of frames is $N_F$, the number of vertical pixels is $N_V$, reset read and signal read are performed, and a half of each cycle can be used for A/D conversion. In this case, the following equation holds.

$$T_{FS}=1/(4N_F N_V) \quad (2)$$

Thus, the following equation holds.

$$f_{clk}=2^{N+2}N_F N_V \quad (3)$$

When the number of frames is 100, the number of vertical pixels is 2000, and the usable clock frequency is on the order of 2 GHz at maximum, the resolution is on the order of 11 bits, which is on the order of 68 dB in terms of dynamic range.

The accuracy of the A/D converter is determined not only by the clock frequency, and the comparator is also a factor for determining the accuracy of the A/D converter. The noise voltage of the comparator is on the order of 100 μV to 200 μV, which is on the order of 75 dB in terms of dynamic range. Therefore, the dynamic range of the slope A/D converter is 70 dB at the best.

The number of electrons handled by the unit sensor is generally several tens of thousands. Thus, if it is assumed that the number of electrons is thirty thousand and the holding capacitor is 5 fF, the maximum output voltage is on the order of 1 V. The minimum value to a signal to be detected is one electron, and this is equivalent to 30 μV. Therefore, a necessary dynamic range is approximately 90 dB. In the slope A/D converter, it is difficult to achieve a high dynamic range that the pixel intrinsically has. Thus, in one sensor device, a higher dynamic range is tried to be acquired by performing correlated double sampling and, as described above, providing a subtraction amplifier with a variable gain on the order of 0 dB to 20 dB before A/D conversion. However, a large capacitor of 10 pF to 20 pF is often used to suppress noise and, as a result, not only an area increase but also an increase in power consumption is invited.

Therefore, the A/D converter currently used in the sensor device does not achieve a high dynamic range required for the sensor at high speed and with low power consumption.

SUMMARY

A time domain A/D converter group according to one aspect of the present invention includes a plurality of individual A/D converters, each of the individual A/D converters is connected to a reference signal generation circuit to generate a first reference signal for sweeping in a full scale range and a second reference signal for repeating plurality of times to sweep in a limited voltage range, and each of the individual A/D converters includes a reference voltage selection circuit for switching the first reference signal or the second reference signal output from the reference signal generation circuit, a comparator for comparing an input signal with the first reference signal or the second reference signal in accordance with a selection by the reference voltage selection circuit, for generating a comparison output signal, an internal A/D converter for performing an A/D conversion using the comparison output signal from the comparator, and an accumulation adder-subtracter for outputting an average signal of A/D conversion values obtained from the A/D conversion when the second reference signal is selected.

In the above-described time domain A/D converter group, the input signal is desired to include a reset signal in a first period and a main signal in a second period, and the accumulation adder-subtractor outputs a difference between a signal obtained from the main signal and a signal obtained from the reset signal as a final A/D conversion value.

In the above-described time domain A/D converter group, each of the individual A/D converters is desired to use a reference signal level as a reference voltage of the comparator before a main conversion and the reference voltage selection circuit selects either the first reference signal or the second reference signal according to a magnitude of the comparison output signal obtained from the comparator.

In the above-described time domain A/D converter group, each of the individual A/D converters is desired to perform the A/D conversion by sweeping from a lower signal level and judges whether the A/D conversion value has reached a reference value or not, and when the A/D conversion value does not reach the reference value, the reference voltage selection circuit selects the second reference signal, and when the A/D conversion value reaches the reference value, the reference voltage selection circuit selects the first reference signal.

In the above-described time domain A/D converter group, each of the A/D converters is desired to perform full scale A/D conversion by sweeping using the first reference signal before a main conversion in a time shorter than a sweep time required for the main conversion and judges whether the A/D conversion value has reached a reference value or not, and when the A/D conversion value does not reach the reference value, the reference voltage selection circuit selects the second reference signal, and when the A/D conversion value reaches the reference value, the reference voltage selection circuit selects the first reference signal.

In the above-described time domain A/D converter group, each of the A/D converters is desired to further include a means for varying a slew rate of the second reference signal when the reference voltage selection circuit selects the second reference signal.

In the above-described time domain A/D converter group, each of the A/D converters is desired to further include a conversion number control circuit for controlling the internal A/D converter to increase a number of sweeps of the reference voltage when a level of the input signal is low and to decrease the number of sweeps of the reference voltage when the level of the input signal is large.

In the above-described time domain A/D converter group, the reference voltage selection circuit is desired to select the second reference signal in the first period.

In the above-described time domain A/D converter group, each of the A/D converters is desired to further include a means for increasing a number of sweeps of the reference voltage in the first period when the A/D conversion value of a previous signal is small, and reducing the number of sweeps of the reference voltage in the first period when the A/D conversion value of the previous signal is large.

In the above-described time domain A/D converter group, each of the A/D converters is desired to further include a comparator control circuit for controlling an operation current source of the comparator, the A/D conversion is performed in a time shorter than a sweep time required for a main conversion before the main conversion to detects a level of the input signal, the comparator control circuit supplies an operating current of the comparator in the vicinity of an input signal detected level, and the comparator control circuit reduces the operating current of the comparator not in the vicinity of the input signal.

In the above-described time domain A/D converter group, the comparator is desired to resample the input signal and the reference signal when a level of the input signal is high.

A time domain A/D converter group according to another aspect of the present invention includes a plurality of comparators for comparing an input signal and a reference signal, a plurality of internal A/D converters for obtaining A/D conversion values from a comparison output signals from the plurality of comparators, and a delay locked loop circuit for dividing a cycle of a master clock that supplies a clock to an entire integrated circuit and outputting a multi-phase clocks with different timings. The plurality of internal A/D converters performs A/D conversion using the multi-phase clock.

In the above-described time domain A/D converter group, the plurality of internal A/D converters is desired to include a plurality of latches for holding a logic state of the multi-phase clock at a timing given by the comparison output signal.

The above-described time domain A/D converter group is desired to further include a logic circuit for synthesizing a plurality of clocks corresponding to gray code from the multiphase clock.

The above-described time domain A/D converter group is desired to further include a gating circuit for gating the plurality of clocks by a gating control signal.

In the above-described time domain A/D converter group, the gating is desired to be performed on a clock corresponding to a LSB when a level of the input signal is low and a target bit is sequentially increased to a MSB side when the level of the input signal increases.

In the above-described time domain A/D converter group, the gating control signal is desired to be generated when a number of clocks from a start of A/D conversion is measured and reached a predetermined number of times.

In the above-described time domain A/D converter group, the gating control signal is desired to be generated when the input signal of a D/A converter which generates the reference voltage reaches a predetermined value.

In the above-described time domain A/D converter group, an electric signal from a sensor is used as an input signal. The sensor includes a signal source for detecting signals in the nature, a reference signal source for supplying a reference signal, and a transistor for transferring these signals to a holding capacitor, and the time domain A/D converter group generates a difference between an A/D conversion result of a voltage applied to a signal in the nature and an A/D conversion result of a voltage applied to the reference signal source as an A/D conversion output.

DESCRIPTION OF EMBODIMENTS

Circumstances Leading to First Embodiment

An A/D converter for use in a conventional sensor device does not achieve a high dynamic range required for the sensor. For example, as described above, when the full-scale voltage is 1 V, read noise is desirably equal to or lower than 30 μV, which is equivalent to the voltage of one electron. By contrast, read noise is currently inadequate, on the order of 100 μV, as disclosed in "8.3 M-Pixel 480-fps Global-Shutter CMOS Image Sensor with Gain-Adaptive Column ADCs and Chip-on-Chip Stacked Integration", Y. Oike, et. al, IEEE Journal of Solid-State Circuits, Vol. 52, No. 4, pp. 985-993, April 2017.

The reason for this is considered to be not only quantization noise of the A/D converter but also various factors such as pixel noise, comparator noise, and reference signal noise.

Figure 25:
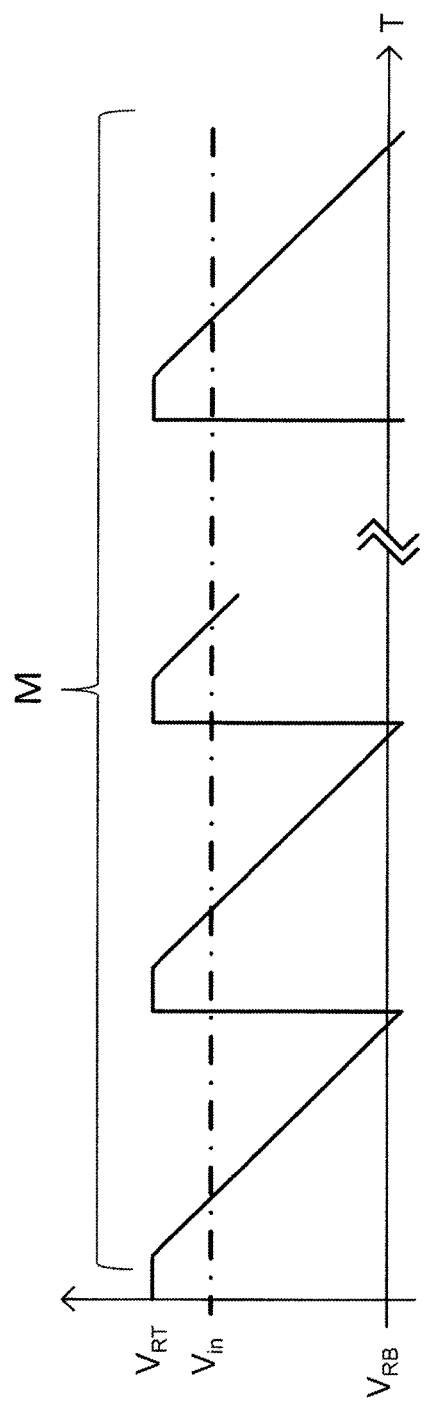
FIG. 25 is a diagram for describing a conventional multisampling technique.

To further reduce noise, it is effective to perform conversion on one signal a plurality of times and output an averaged signal as an A/D conversion output, as disclosed in "Effectiveness of a correlated 5 multiple sampling differential average for reducing 1/f noise", N. Kawai and S. Kawahito, IEICE Electronics Express, Vol. 2, No. 13, 379-383, 2005 and shown in FIG. 25. For an input signal $V_{in}$, sweeping is performed between reference voltages $V_{RT}$ and $V_{RB}$ by using a ramp wave. A comparator sets a flag when the input signal $V_{in}$ becomes higher than the reference voltages to stop a counter, and outputs a count value as an A/D converter value for the input signal $V_{in}$. This A/D conversion operation is repeated M times. These conversion values M times are subjected to averaging process to acquire a final conversion output. In this case, noise voltage is decreased to 1/square root of M. For example, noise voltage can be decreased to ½ when M is 4 and ¼ when M is 16. This method is called multisampling, and can decrease not only quantization noise of the A/D converter but also various noises such as pixel noise, comparator noise, and reference signal noise. Therefore, this method is quite effective for noise reduction.

However, the multisampling technique has a major drawback and is not often used. That is, multiplying the number of times of A/D conversion by M means decreasing the conversion frequency to 1/M and, at the same time, multiplying power consumption by M.

As a result of diligent studies on the above-described phenomenon, the inventor has reached the present invention. The present invention can provide a wide-dynamic-range time domain A/D converter capable of decreasing noise without inviting a decrease in conversion frequency or an increase in power consumption and a device using the time domain A/D converter.

First Embodiment (A/D Converter Using Two Reference Voltage Signals)

Figure 1:
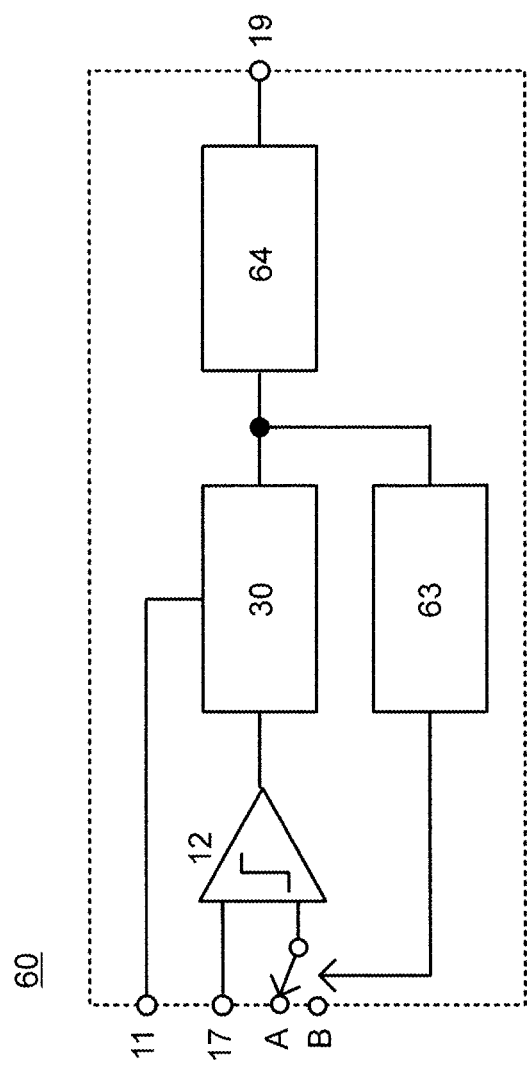
FIG. 1 is a circuit diagram of an A/D converter according to one embodiment of the present invention.

FIG. 1 shows an A/D converter 60 according to a first embodiment of the present invention. The A/D converter 60 according to the first embodiment includes a comparator 12, an internal A/D converter 30, a reference voltage selection circuit 63 having slope signals of two types as reference voltages and switching between the reference voltages, and an accumulation adder-subtracter 64 performing cumulative addition or cumulative subtraction on a plurality of conversion values, and outputs an averaged output as an A/D conversion value.

In the A/D converter 60 according to the first embodiment, the comparator 12 compares a pixel signal and the slope signals as reference signals, generates a comparison output at the timing when two signals cross, and controls a counter to acquire an A/D conversion value. The slope signals of two types for use are a full slope signal corresponding to a pixel full-scale signal as a reference voltage A and a local slope signal for repeatedly sweeping a part of a voltage range in the full slope signal a plurality of times as a reference voltage B. The A/D converter 60 has the reference voltage selection circuit 63 connected to the internal A/D converter 30. The reference voltage selection circuit 63 switches the reference voltage to the full slope signal of the reference voltage A or the local slope signal of the reference voltage B. The A/D converter 60 further includes the accumulation adder-subtracter 64 connected to the internal A/D converter 30. The accumulation adder-subtracter 64 performs cumulative addition or cumulative subtraction on the plurality of A/D conversion values acquired by A/D conversion at the internal A/D converter 30, and forms an averaged A/D conversion output 19.

Figure 2:
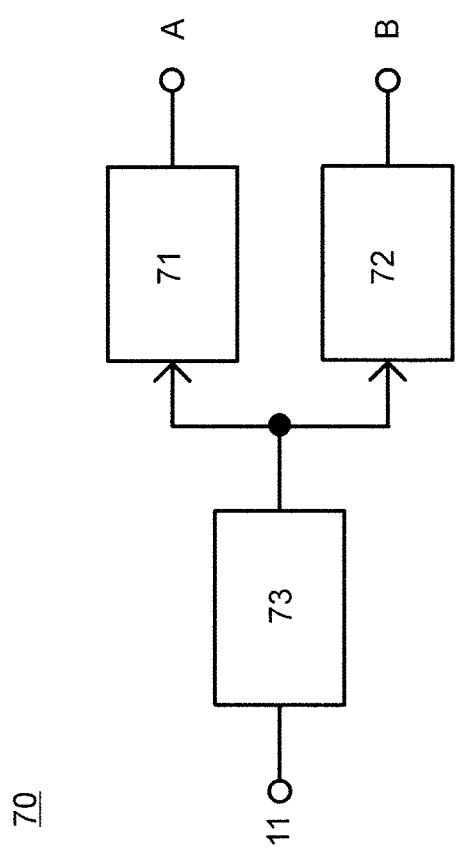
FIG. 2 is a circuit diagram of a reference voltage circuit according to one embodiment of the present invention.

FIG. 2 shows a reference voltage circuit 70. The slope signals of two types as reference voltage are formed at the reference voltage circuit 70. The reference voltage circuit 70 includes a reference voltage control circuit 73, a reference voltage A generation circuit 71, and a reference voltage B generation circuit 72. The reference voltage A generation circuit 71 and the reference voltage B generation circuit 72 are each connected via a reference voltage control circuit 73 to a clock input terminal 11. In synchronization with a clock signal inputted to the clock input terminal 11, the reference voltage control circuit 73 controls the reference voltage A generation circuit 71 and the reference voltage B generation circuit 72 to generate the reference voltage A and the reference voltage B.

(First Reference Voltage Control Method)

Figure 3:
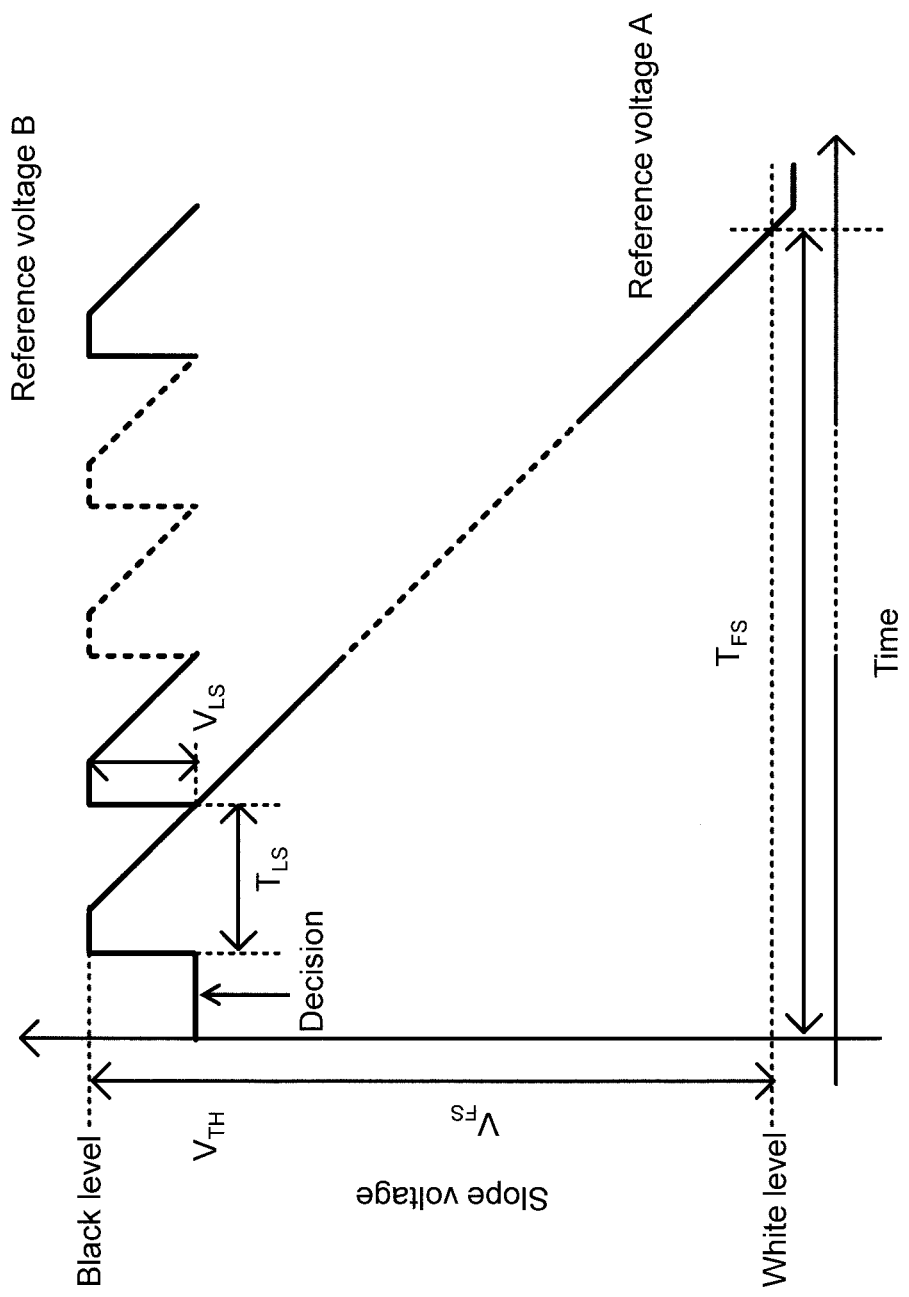
FIG. 3 is a diagram for describing a method of controlling the reference voltage circuit according to one embodiment of the present invention.

FIG. 3 shows a first reference voltage control method. In the first control method, a threshold voltage $V_{TH}$ is given as a reference voltage for all comparisons, and A/D conversion is performed only by the comparator. When the signal is smaller than the threshold voltage $V_{TH}$, the reference voltage B is selected as a reference voltage, A/D conversion is performed many times by using the local slope signal, and the accumulation adder-subtracter 64 is used to output an average value. When the signal is larger than the threshold voltage $V_{TH}$, the reference voltage A is selected as a reference voltage, and A/D conversion is performed by using the full slope signal. With this control method, the A/D converter can decrease an effective A/D conversion noise voltage in a required signal voltage region.

(Second Reference Voltage Control Method)

Figure 4:
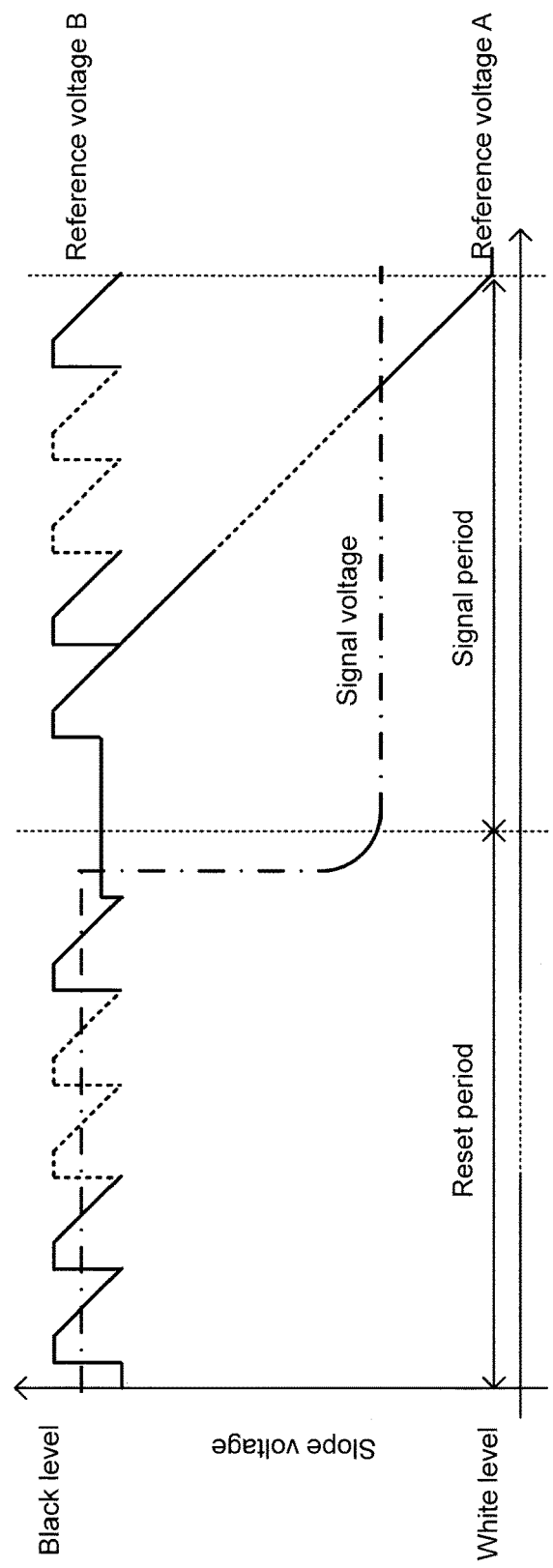
FIG. 4 is a diagram for describing the method of controlling the reference voltage circuit according to one embodiment of the present invention.

FIG. 4 shows a second reference voltage control method. In the second control method, the reference voltage B is selected for a reset signal (or reference signal) sent from a pixel in a reset period, A/D conversion is performed many times by using the local slope signal, and an average value of the reset signals (or reference signals) is outputted by using the accumulation adder-subtracter 64. Next, for a main signal sent from a pixel in a signal period, the reference voltage B is selected as a reference voltage when the main signal is smaller than the threshold voltage $V_{TH}$, A/D conversion is performed many times by using the local slope signal, and an average value is outputted by using the accumulation adder-subtracter 64. When the main signal is larger than the threshold voltage $V_{TH}$, the reference voltage A is selected as a reference voltage, and A/D conversion is performed by using the full slope signal. Finally, a difference between the average value of the reset signals and the main signal is taken by the accumulation adder-subtracter 64 to perform correlated double sampling, a DC offset is cancelled, and 1/f noise is reduced. When the fluctuation voltage of the reset signal is larger than the sweep voltage of the reference voltage B, the reference voltage A may be selected in accordance with the threshold in a manner similar to that of the main signal.

As described above, in the present invention, unlike the conventional multisampling technique, the multisampling technique is applied only to a subtle signal at a black level, a limited voltage range of the reference voltage range is swept many times to perform A/D conversion, and noise is decreased by averaging process. Thus, the present invention has an excellent feature of not inviting a decrease in A/D conversion frequency and an increase in power consumption, which are major drawbacks of the conventional multisampling technique.

In the present embodiment, the slope signals of two types, that is, the reference voltage A and the reference voltage B, are used as reference voltages. However, the present embodiment is not limited to this. The reference voltage circuit 70 can include two or more reference voltage B generation circuits 72. This structure allows the use of, as reference voltages, the full slope signal and local slope signals of two types or more for repeatedly sweeping different voltage ranges which are part of the full slope signal a plurality of times. Thus, the multisampling technique can be applied in a multistage manner to a subtle signal near the black level, thereby allowing an efficient decrease in noise and reduction in power consumption.

Figure 5:
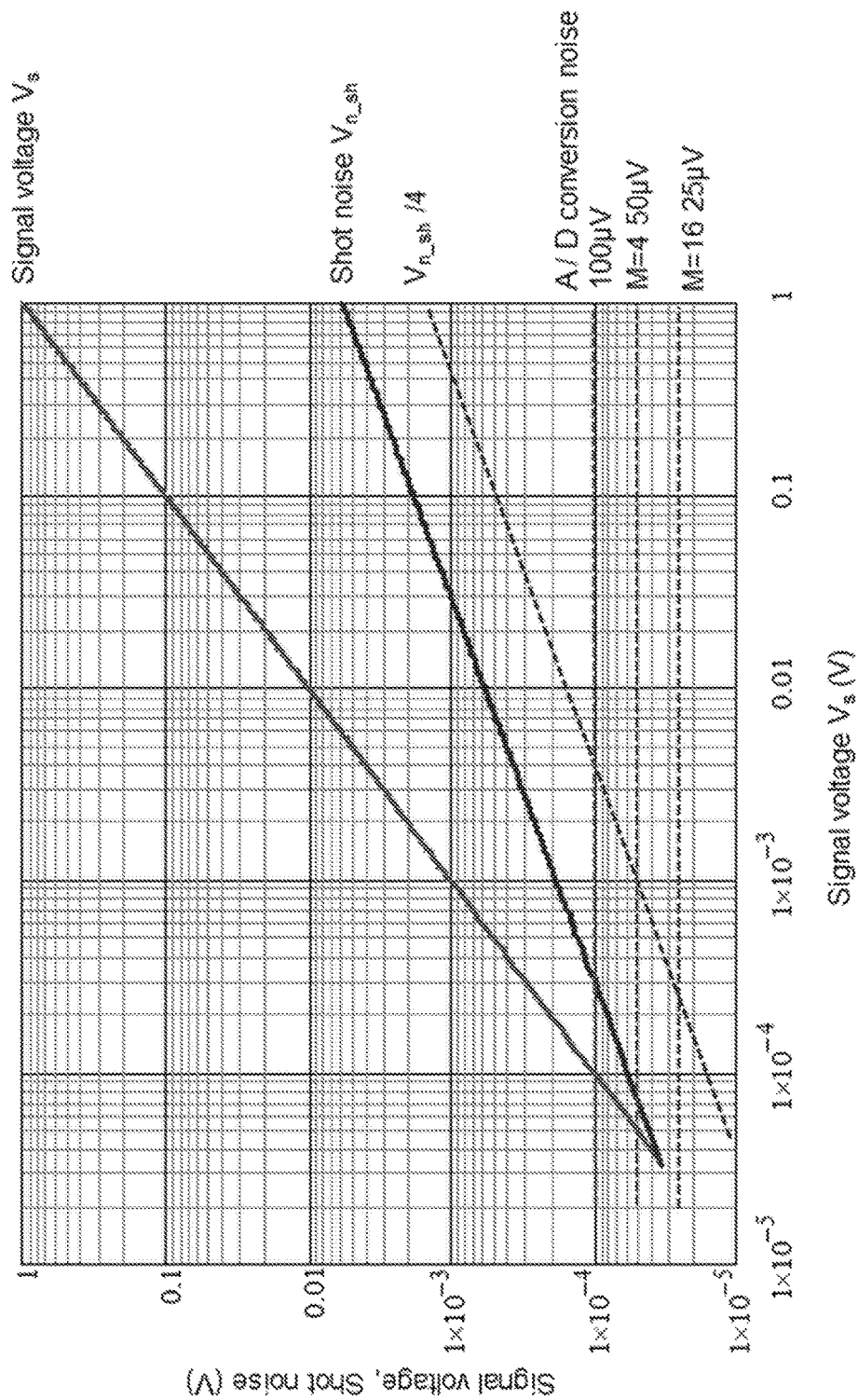
FIG. 5 is a characteristic diagram of a pixel signal voltage and shot noise according to one embodiment of the present invention.

By using FIG. 5, it is described in detail below that the limited voltage range of the reference voltage range is swept many times to perform A/D conversion and noise can be effectively decreased by averaging process. FIG. 5 shows a signal voltage $V_S$ of a pixel signal with a conversion gain $G_e$ at 30 µV per photoelectron and a shot noise $V_{n\_Sh}$. The full scale voltage is assumed to be 1 V. For the number of electrons n, the signal voltage $V_S$ and the shot noise $V_{n\_Sh}$ can be each represented by the following equations.

$$V_S = G_e n \quad (1)$$

$$V_{n\_Sh} = G_e \sqrt{n} \quad (2)$$

Read noise such as quantization noise voltage of the A/D converter is inconspicuous if the read noise is lower than this shot noise $V_{n\_Sh}$. However, by contrast to the random shot noise, the quantization noise of the A/D converter has a biased noise distribution, and therefore the human eyes are highly sensitive to the quantization noise. Thus, a criterion of the read noise of the A/D converter is set at ¼ of the shot noise $V_{n\_Sh}$, which is indicated by a broken line $V_{n\_Sh}/4$. Here, when the A/D conversion noise is 100 µV, this criterion is not satisfied if the signal voltage $V_S$ is equal to or lower than 4 mV.

On the other hand, in the multisampling technique, A/D conversion is performed M times, and averaging process is performed. Thus, a conversion noise $V_{n\_ADC}$ attenuates as follows.

$$V_{n\_M} = \frac{V_{n\_ADC}}{\sqrt{M}} \quad (3)$$

Therefore, the conversion noise is half, that is, 50 µV, when M=4, and is ¼, that is 25 µV, when M=16. Thus, by multisampling or oversampling, not only the quantization noise of the A/D converter but also the noise of the slop signal and noise of a source follower of a pixel can be decreased.

In the present invention, by giving the threshold voltage $V_{TH}$ as a reference voltage for all comparisons, and thus the multisampling technique is applied to only a small signal voltage requiring low noise. This allows effective reduction in read noise without inviting a decrease in conversion frequency and an increase in voltage consumption. For example, if the threshold voltage $V_{TH}$ is set at 20 mV, the read noise is ¼ of the shot noise inevitably included in a pixel signal when the voltage of the pixel signal is equal to or larger than 20 mV. When the voltage is equal to or smaller than 20 mV and conversion is performed four times, the read noise is decreased by half to 50 µV. When the pixel signal voltage is equal to or larger than 1 mV, the read noise is equal to or smaller than ¼ of the shot noise. When conversion is performed sixteen times, the read noise is decreased to 25 µV, that is ¼, thereby achieving read noise lower than the voltage of one electron.

A conversion time to the full scale voltage $V_{FS}$ is $T_{FS}$ with a disregard of a determination time, a local slope signal amplitude is $V_{LS}$, and a time for one cycle is $T_{LS}$ with a disregard of a set time. In this case, the following relation holds.

$$\frac{T_{FS}}{T_{LS}} = \frac{V_{FS}}{V_{LS}} \quad (4)$$

Here, when $V_{FS}$ is 1 V and $V_{LS}$=20 mV, $T_{FS}/T_{TH}$=50. This indicates that conversion can be performed for the local slope signal up to approximately thirty-two times even if a temporal margin is taken, and therefore this practically has no problem at all.

As described above, in the present invention, the limited voltage range of the reference voltage range is swept many times to perform A/D conversion, and averaging process is performed, thereby allowing an effective decrease in noise without inviting an increase in conversion time. Also, in the time domain A/D converter, power consumption is proportional to the conversion time with the same clock frequency. Therefore, even if sweeping many times to perform A/D conversion does not invite an increase in conversion time. Thus, an excellent characteristic of not increasing power consumption can be achieved.

In setting the number of times of conversion, the larger the number of times of conversion is, the less read noise, thereby achieving high image quality. However, the tradeoff for this is an increase in power consumption. Moreover, there is a property that while read noise is not a bother on a screen with a lower black level and a higher white level, read noise is a bother on a screen with a higher black level. Therefore, an optimum value should be able to be set based on the state of the screen and the state of power consumption.

(Third Reference Voltage Control Method)

Figure 6:
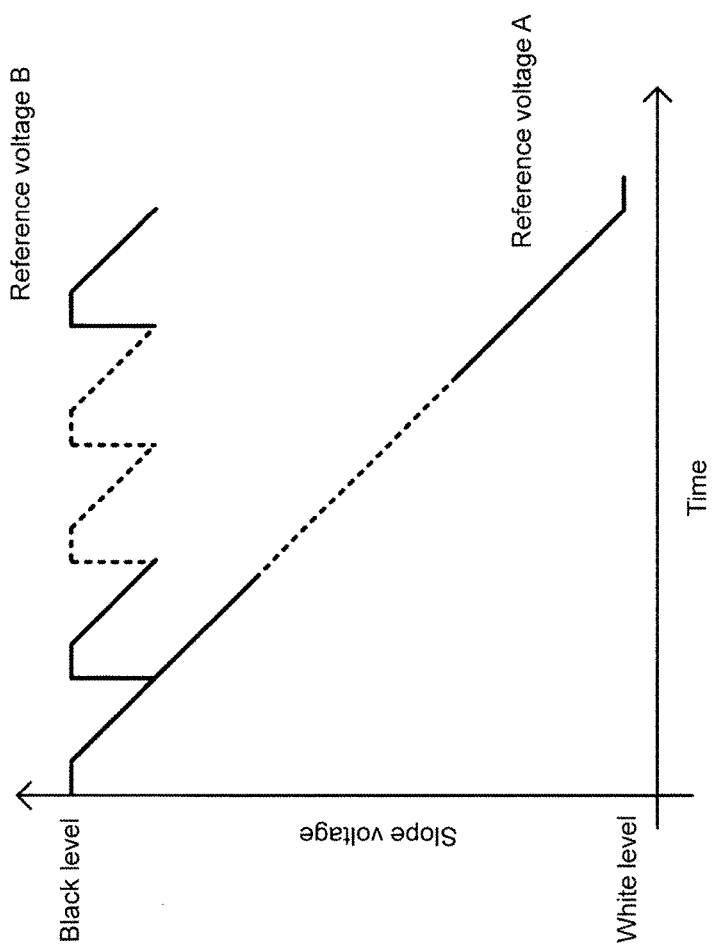
FIG. 6 is a diagram for describing the method of controlling the reference voltage circuit according to one embodiment of the present invention.

FIG. 6 shows a third reference voltage control method. In this method, the local slope signal of the reference voltage B is selected by all comparators, and the reference voltage is swept from the black level, that is, a subtle signal level. When conversion ends without the A/D conversion value reaching the reference value, the local slope signal of the reference voltage B is still selected, A/D conversion is performed many times, and an average value is outputted by using the accumulation adder-subtracter 64. When the value in the course of conversion exceeds the reference value, the full slope signal of the reference signal A is selected, and A/D conversion is performed. By controlling the reference voltage in this manner, in the third reference voltage control method, it is not required to set a threshold based on the necessary reference voltage, and thus the conversion time can be reduced.

(Fourth Reference Voltage Control Method)

Figure 7:
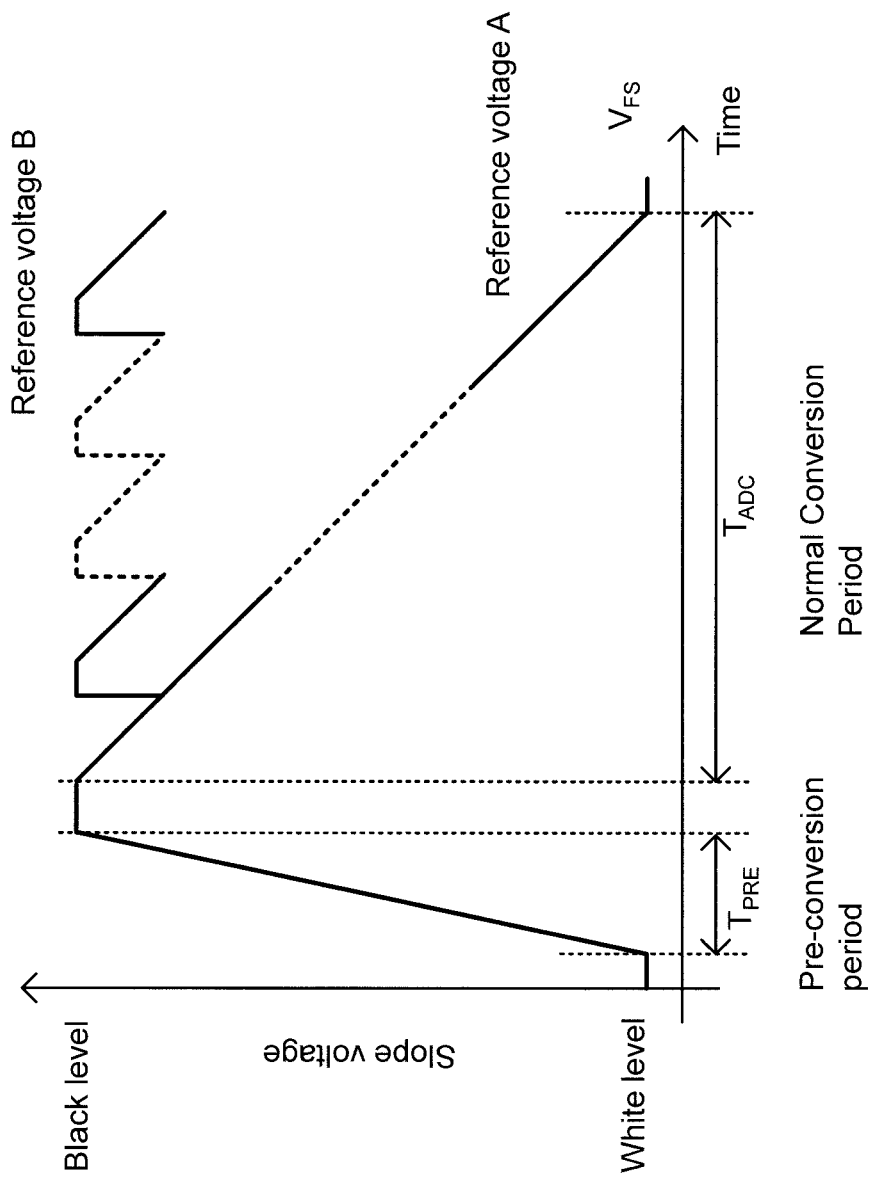
FIG. 7 is a diagram for describing the method of controlling the reference voltage circuit according to one embodiment of the present invention.

FIG. 7 shows a fourth reference voltage control method. In this method, prior to a normal conversion period $T_{ADC}$, a pre-conversion period $T_{PRE}$ is provided, and A/D conversion is performed with the pre-conversion period being sufficiently shorter than the normal conversion period. When the conversion period is shortened, the resolution of A/D conversion is decreased. However, this does not pose a problem so much because it is enough to detect an approximate signal level. In pre-conversion, when the conversion value is below the reference value, the local slope signal of the reference voltage B is selected, A/D conversion is again performed many times, and an average value is outputted by using the accumulation adder-subtracter 64. When the conversion value exceeds the reference value, the full slope signal of the reference voltage A is selected, and A/D conversion is performed.

(Variable Slew rate of Local Slope Signal)

Figure 8:
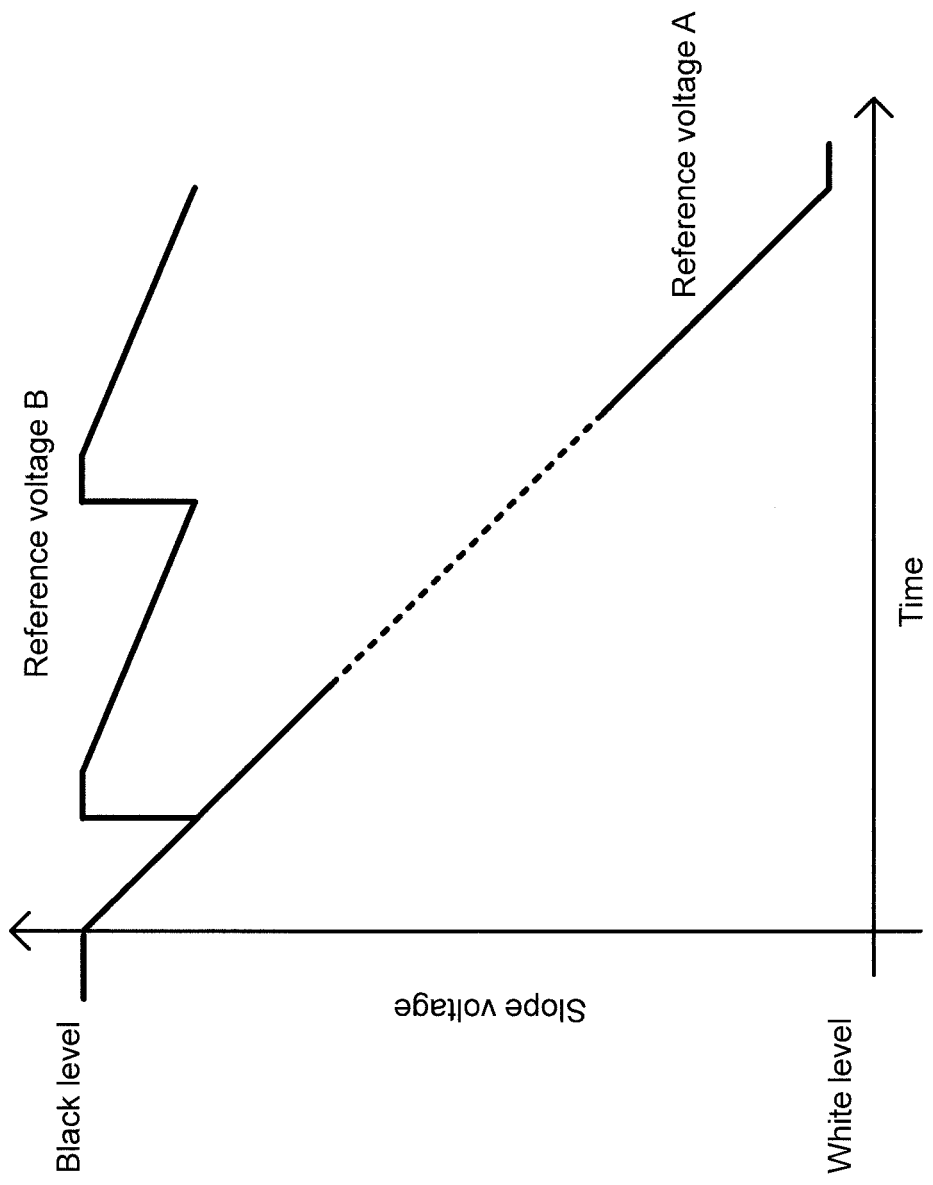
FIG. 8 is a diagram for describing the method of controlling the reference voltage circuit according to one embodiment of the present invention.

In the above description, slew rates of the full slope signal of the reference voltage A and the local slope signal of the reference voltage B are assumed to be equal. However, the slew rates of the full slope signal of the reference voltage A and the local slope signal of the reference voltage B may be different. For example, as shown in FIG. 8, the slew rate of the local slope signal of the reference voltage B can be decreased. In the time domain A/D converter, decreasing the slew rate of the reference voltage by using the same clock frequency has an effect of reducing quantization voltage and decreasing quantization noise. Therefore, if decreasing the slew rate has an effect of decreasing quantization noise, the slew rate of the local slope signal of the reference voltage B is preferably decreased. However, if noise other than quantization noise is dominant, the entire noise level is decreased by increasing the number of times of multisampling without decreasing the slew rate much. Therefore, there is an optimum slew rate.

(Control Over Number of Times of A/D Conversion)

Figure 9:
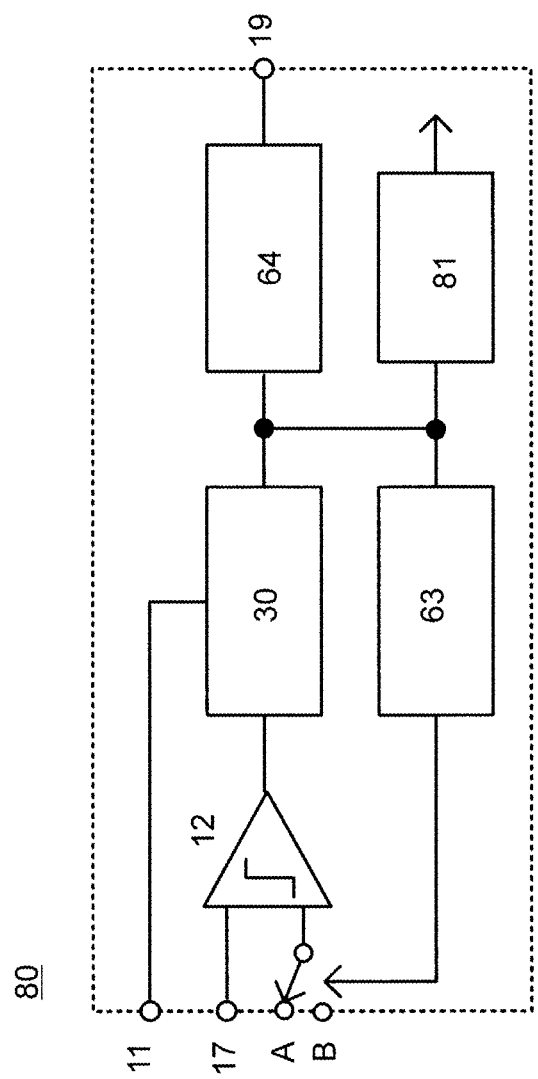
FIG. 9 is a circuit diagram of an A/D converter according to one embodiment of the present invention.

Also as shown in FIG. 5, noise of the A/D converter is required to be low when the signal is small, but noise is not required to be low that much when the signal is large. Thus, as shown in FIG. 9, an A/D converter 80 may be provided with a conversion number control circuit 81 to perform conversion many times when the signal is small and decrease the number of times of conversion when the signal is large. The conversion number control circuit 81 is connected to the internal A/D converter 30, the accumulation adder-subtracter 64, and the reference voltage selection circuit 63. The conversion number control circuit 81 determines the number of times of conversion based on the conversion value of the internal A/D converter 30, and controls the comparator, the clock of the internal A/D converter 30, and the accumulation adder-subtracter 64. For example, in FIG. 5, conversion is performed four times when the signal level is from 4 mV to 1 mV, sixteen times when the signal level is from 1 mV to 400 µV, and thirty-two times when the signal level is smaller than 400 µV. Thus, the A/D conversion noise can be made on the order of ¼ of the shot noise voltage.

(Control over Number of Times of A/D Conversion of Reset Level)

In A/D conversion of the reset level (or reference signal), since the conversion target signal is circuit noise or offset voltage, it is difficult to determine the number of times of conversion based on the conversion signal level. What is important is a difference between the reset level and the signal level, and therefore low noise is allowed when the signal level is small and large noise is allowed when the signal level is high. Thus, means which controls the number of times of conversion is provided so that the number of times of conversion is increased to decrease A/D conversion noise when the signal level immediately before A/D conversion of the reset level is small and the number of times of conversion is decreased to allow A/D conversion noise to some extent when the signal level is large. This means allows a decrease in A/D conversion noise while reducing an increase in power consumption due to an increase in the number of times of conversion.

(Control Over Operating Current of Comparator)

Figure 10:
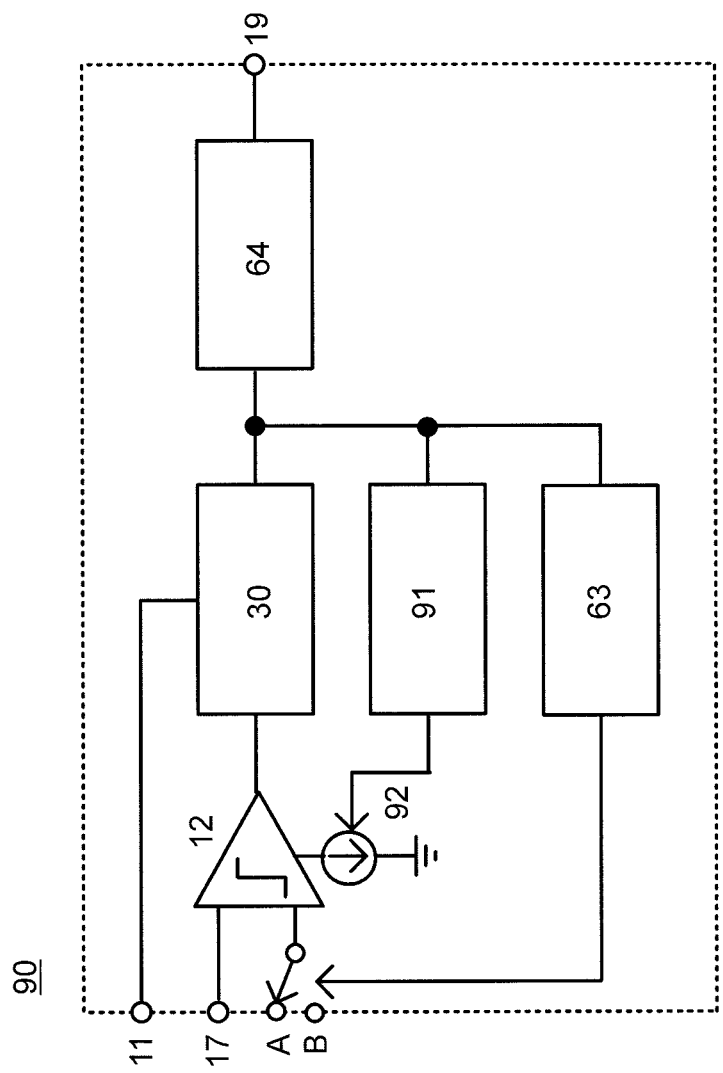
FIG. 10 is a circuit diagram of an A/D converter according to one embodiment of the present invention.
Figure 11:
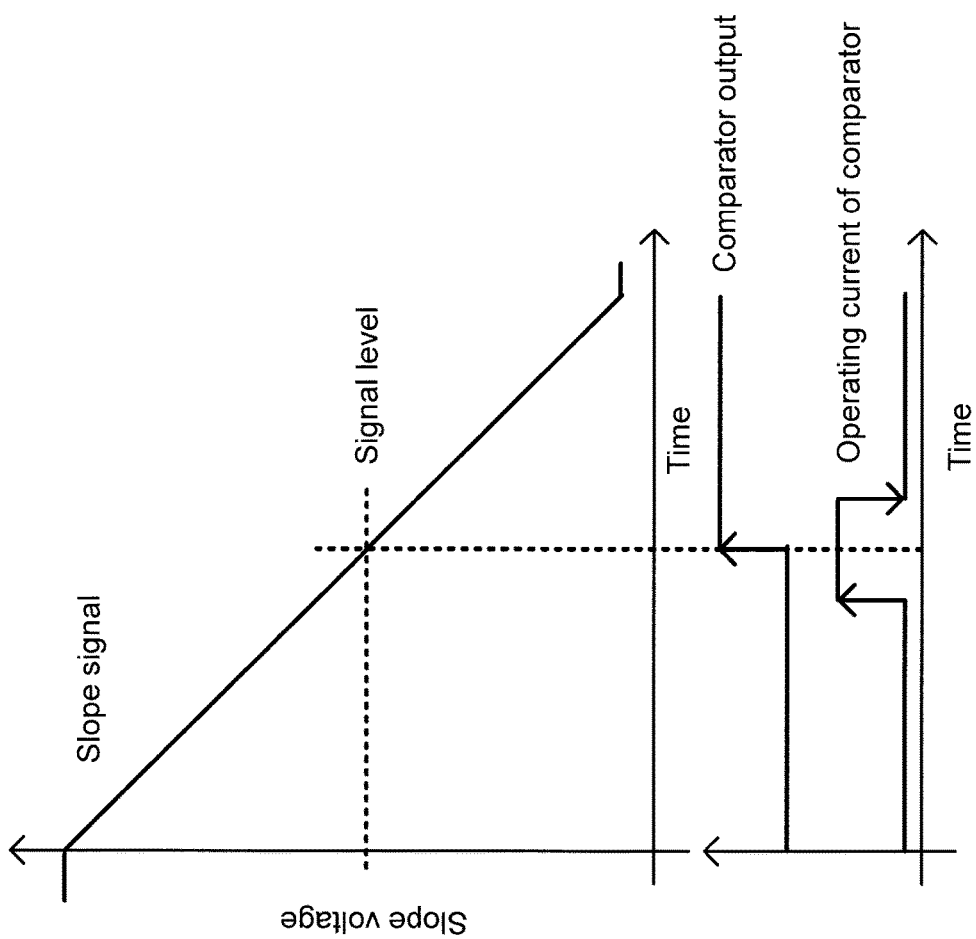
FIG. 11 is a diagram for describing a method of controlling operation current of a comparator according to one embodiment of the present invention.

The operating current of the comparator for use in the time domain A/D converter is several µA to several tens of µA, and the comparator thus generally operates with such a small current. However, since the number of A/D converters in a column A/D converter are several thousands, current consumption in the entire sensor device is not negligible. Thus, low power consumption is desired as much as possible. For this reason, as shown in FIG. 10, a comparator control circuit 91 may be provided to control an operating current source 92 of the comparator. The comparator control circuit 91 is connected to the internal A/D converter 30 and the reference voltage selection circuit 63. In the control method, firstly, in the pre-conversion period shown in FIG. 7, an approximate signal level is found in a short period, and this signal level is stored. Next, since a counter configuring the internal A/D converter starts counting time from the time when the slope signal descends in the normal conversion shown in FIG. 11, the operating current of the comparator is increased from a low bias to a predetermined operating current immediately before the slope signal approaches the stored signal level. When the slope signal reaches the signal level, a comparator output sets a flag, and thus the counter configuring the internal A/D converter stops counting, and this count value serves as an A/D conversion value. This makes the operation of the comparator unnecessary, and the operating current of the comparator is returned to a low bias state. By controlling the operating current of the comparator in this manner, power consumption of the time domain A/D converter can be reduced.

(Control Over Operating Mode of Comparator)

Figure 12:
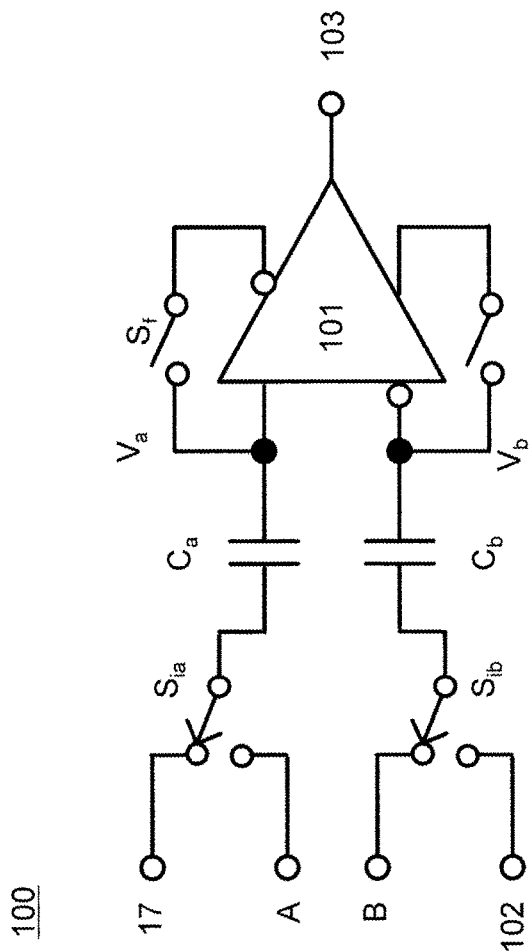
FIG. 12 is a circuit diagram of the comparator according to one embodiment of the present invention.

While the comparator is an important circuit which compares an input signal and a reference voltage and outputs a magnitude relation as a comparison output, the comparator generates noise and generates an offset voltage depending on the input signal level as well. FIG. 12 shows a comparator 100 in the present invention. A capacitor $C_a$ is inserted between an amplifier 101 and an input switch $S_{ia}$. A capacitor $C_b$ is inserted between the amplifier 101 and an input switch $S_{ib}$. A switch $S_f$ is inserted between differential input and output of the amplifier 101.

Figure 13A:
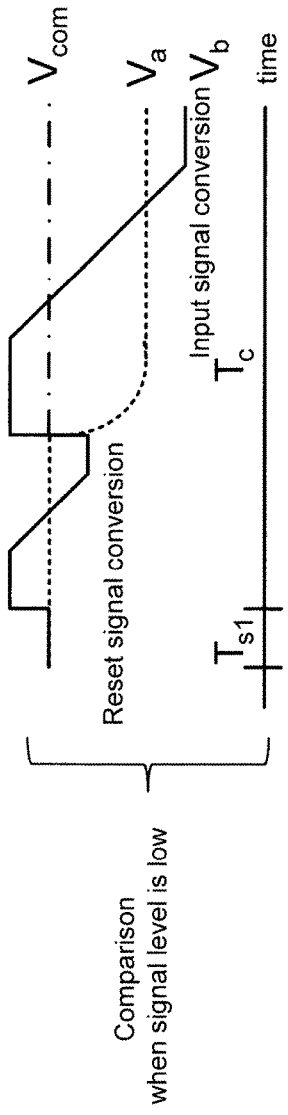
FIG. 13A is a diagram for describing a method of controlling the comparator according to one embodiment of the present invention.
Figure 13B:
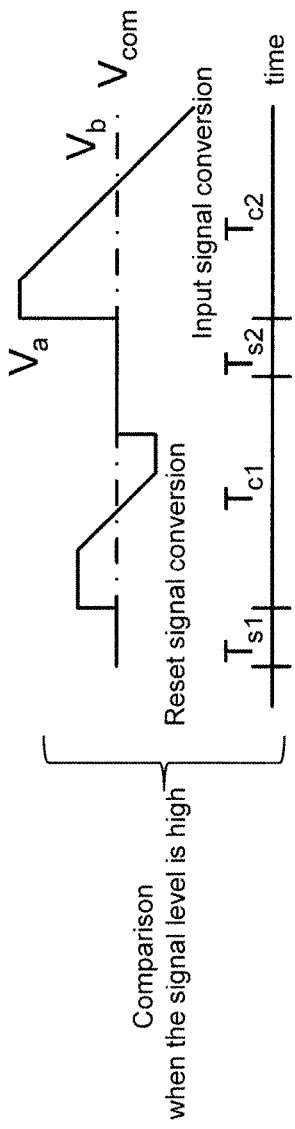
FIG. 13B is a diagram for describing the method of controlling the comparator according to one embodiment of the present invention.

FIG. 13A and FIG. 13B each show the state of comparison with different operation modes. $V_a$ and $V_b$ denote voltages of two input terminals of the comparator 100. $V_{com}$ is a common voltage occurring at an input end when the switch $S_f$ is closed. Normal operation is shown in FIG. 13A. For a pixel reset signal in a first period $T_{S1}$, the switch $S_{ia}$ first selects a pixel signal input terminal 17, the switch $S_{ib}$ selects the reference signal B, and the switch $S_f$ is closed. Here, the input voltages $V_a$ and $V_b$ of the amplifier are both $V_{com}$. Next, the switch $S_f$ is opened, and the reference voltage B is once slightly increased and then decreased with a slope. A comparison output 103 is outputted when the voltage $V_a$ and the voltage $V_b$ cross, thereby completing reset signal conversion. Next, a pixel signal is sent. The voltage $V_a$ decreases in accordance with the pixel signal level. The reference voltage B is once increased and then decreased with a slope. The comparison output 103 is outputted when the voltage $V_a$ and the voltage $V_b$ cross, thereby completing pixel signal conversion. While these conversions are currently performed, there is a problem in which the voltage when the pixel signal $V_a$ and the reference voltage $V_b$ cross does not match the common voltage $V_{com}$ occurring when the switch $S_f$ is closed and is substantially different therefrom, thereby causing an offset voltage and degrading linearity.

Thus, in the present invention, signal comparison is performed as shown in FIG. 13B. Conversion of the reset signal is similar to that described above. When conversion of the reset signal ends, the switch $S_{ib}$ is switched to the common voltage $V_{com}$. Next, a pixel signal is generated, and the switch $S_f$ is closed when the state reaches a sufficient settling state. Here, the voltage $V_a$ and the voltage $V_b$ are both the common voltage $V_{com}$. Next, the switch $S_f$ is opened, and the switch $S_{ia}$ selects the reference voltage A. The reference voltage A is decreased from a high voltage with a slope. The voltage $V_b$ is constant, and the timing when crossing the voltage $V_a$ gives a conversion value of the pixel signal. Since the voltage when the pixel signal $V_a$ and the reference voltage $V_b$ cross is the common voltage $V_{com}$, no offset occurs, and therefore conversion can be made with favorable linearity. However, when this operation is performed, the switch is switched twice, and thus noise power occurring at the capacitors $C_a$ and $C_b$ is doubled, thereby disadvantageously increasing noise. Thus, when the input signal level is low, which means that noise influences are large, normal comparison is performed as shown in FIG. 13A. When the input signal level is high, which means that noise influences are small and offset voltage influences are large, the scheme of sampling the signal twice as shown in FIG. 13B is used.

Circumstances Leading to Second Embodiment

In the time domain A/D converter, it is required to increase the clock frequency in order not only to increase conversion speed but also to decrease quantization noise to increase the dynamic range. However, this invites an increase in power consumption, and there is a serious tradeoff between the conversion speed and dynamic range and power consumption, inhibiting an improvement in performance and a reduction in power consumption of the sensor device.

To this problem, Japanese Unexamined Patent Application Publication No. 2011-254246 discloses that not only a counter but also a time to digital converter (TDC) is used to decrease the clock frequency, reduce power consumption, or increase effective resolution.

Figure 26:
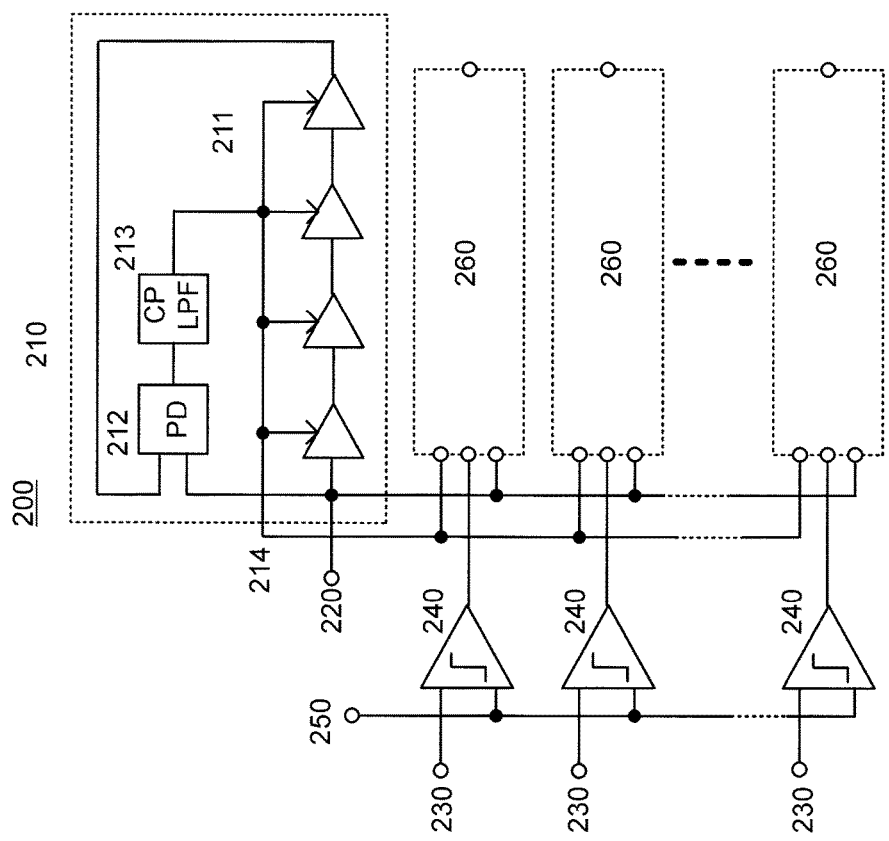
FIG. 26 is a circuit diagram of a conventional A/D conversion block.
Figure 27:
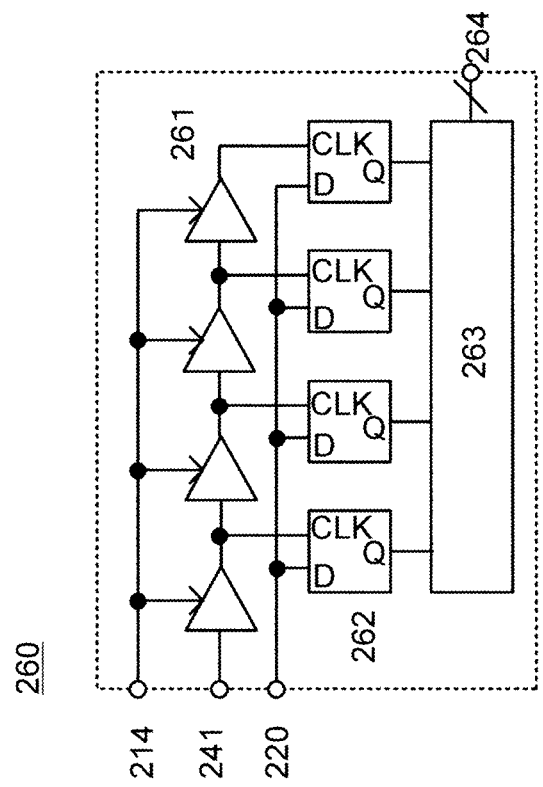
FIG. 27 is a circuit diagram of a conventional A/D converter.

FIG. 26 shows the structure of a time quantizer 200 described in Japanese Unexamined Patent Application Publication No. 2011-254246. The time quantizer 200 includes a delay locked loop (DLL) circuit 210. By using a delay circuit 211, a phase detector (PD) 212, and a charge pump (CP) and low-pass filter (LPF) 213 of the delay locked loop (DLL) circuit 210, a clock signal delayed at the delay circuit 211 is controlled to be delayed by one clock with respect to an input clock 220. A plurality of pixel signals 230 are each compared at a comparator 240 with a ramp signal 250, and the comparator 240 generates a comparison output at the timing in accordance with the voltage of the pixel signal. This signal is inputted to a time to digital converter (TDC) 260. Each TDC 260 is configured as shown in FIG. 27. The comparison output signal from the comparator 240 is inputted to a delay circuit 261 with unit delay circuits connected in series and each delay time being controlled by a delay control signal 214. The TDC 260 is provided with a plurality of D latches or D flip-flops 262 with an input clock 220 taken as a common input, fetching a clock with the comparison output from the comparator 240 delayed by a predetermined timing by the delay circuit 261. With the output from each D latch or D flip-flop 262 being decoded by a decoder 263, delay information about the comparison signal from the comparator 240 can be acquired. Here, the delay control signal 214 is generated at the DLL circuit 210 commonly provided to the respective TDCs 260, and is supplied to each TDC 260.

With this structure, a lower bit with resolution higher than the clock frequency can be achieved. Also, compared with the conventional scheme for A/D conversion by using only a counter, the clock frequency can be ½M when the number of bits of the TDC 260 is M. Thus, Japanese Unexamined Patent Application Publication No. 2011-254246 describes that power consumption for clock distribution can be reduced, the technique is of an event-driven type because a flag signal from the comparator 240 is outputted only once, constant current consumption is prevented, and an increase in power consumption of an additional TDC 260 is extremely subtle. Also, the structure is such that the DLL circuit 210 is arranged at an end of the column and the control voltage is supplied to the entire column.

However, the method described in Japanese Unexamined Patent Application Publication No. 2011-254246 has some practical problems. Firstly, with the delay circuit 261 arranged inside the TDC 260, each TDC 260 requires the delay control signal 214. Since the delay control signal 214 is an analog signal, it is sensitive to noise. When the delay control signal 214 carries noise, the delay time is varied, and conversion accuracy is disadvantageously degraded.

Also, the structure is such that the DLL circuit 210 which generates the delay control signal 214 is arranged at an end of the column, and the delay control signal 214 is supplied to the entire column. A CMOS image sensor using the TDCs 260 has several thousands of horizontal pixels, and thus the number of TDCs 260 is also several thousands, and a distance to the TDC 260 furthest away from the DLL circuit 210 is several mm to several tens of mm. Thus, it is expected that there are broad variations in threshold voltage between a transistor inside the DLL circuit 210 and a transistor distanced away therefrom, and there is a concern that deviation in delay time is larger as the distance is longer.

Also, with routing over a long distance, the potential of the ground line and the potential of the power supply line have dependency on distance, and there is a concern that the delay time is significantly changed depending on the position of the TDC 260. Also, with the delay circuit 261 arranged inside the TDC 260, the area is increased compared with the case in which only D latches or D flip-flops are used. Furthermore, due to random threshold variations of the transistor configuring the delay circuit 261, there is a concern that the timing of each TDC 260 is shifted. These threshold variations are proportional to 1/square root of the gate area of the transistor, and therefore the gate area is required to be increased to reduce a timing shift, and there is a concern that it is difficult to achieve a fine pitch matching the pixel pitch required as a column A/D converter.

Moreover, while Japanese Unexamined Patent Application Publication No. 2011-254246 describes that the circuit is of an event-driven type, constant current consumption is prevented, and therefore an increase in power consumption of an additional TDC is extremely subtle. However, the plurality of D latches or D flip-flop are driven by a clock, and some degree of power is considered to be consumed. Still further, with power consumption increasing in proportional to $2^M$ with respect to a resolution M, it is thus difficult to achieve a TDC with high resolution.

To this problem, the method described in Japanese Unexamined Patent Application Publication No. 2008-92901 achieves a TDC without having a delay circuit therein but only including a D latch or D flip-flop therein by fetching a comparator output signal from the comparator with multi-phase clocks, with their phases equally divided, generated by ring oscillators at a plurality of stages of a phase locked loop (PLL) circuit which generates a clock. By using this method, various problems as described above due to the delay circuit provided inside the TDC are resolved.

However, in this method, multiphase clocks are required to be supplied to each TDC. Thus, it is required to equally supply a clock over a long distance, the capacity of global wiring, a clock buffer, and so forth is increased and, to begin with, the number of clocks is increased. Therefore, compared with the method of using only a counter, the use of TDCs can increase resolution with the same clock frequency but disadvantageously increases power consumption. Also, while the use of TDCs can decrease the clock frequency itself with the same resolution, the number of clocks is increased, and therefore they are cancelled out each other and hardly have an effect on reduction in power consumption.

As a result of diligent studies on the above-described phenomenon, the inventor has reached the present invention. The present invention can provide a time domain A/D converter capable of improving resolution without increasing power consumption or capable of reducing power consumption with the same resolution, and also a sensor device using the time domain A/D converter.

Second Embodiment (Time Domain A/D Conversion Block Including Plurality of A/D Converters Using Multi-Phase Clocks Generated by DLL Circuit)

Figure 14:
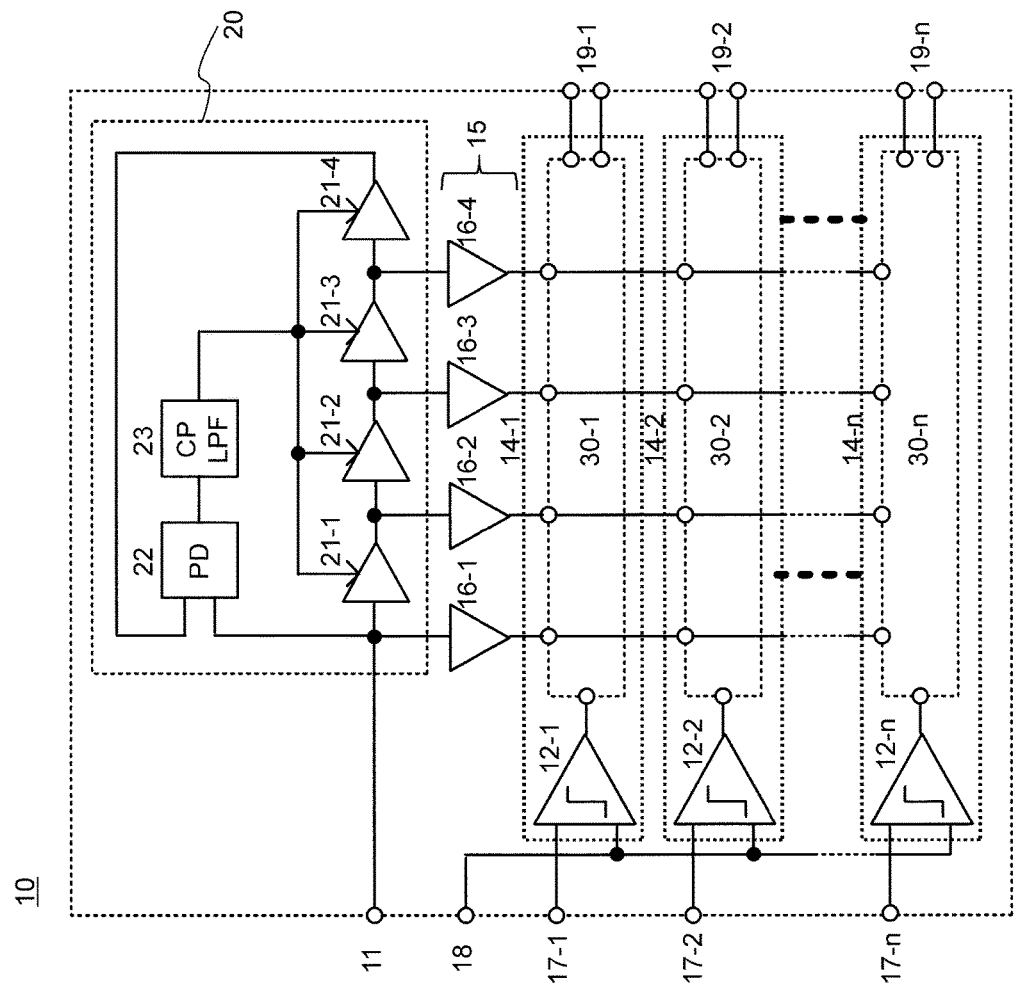
FIG. 14 is a circuit diagram of an A/D conversion block according to one embodiment of the present invention.

FIG. 14 shows a time domain A/D conversion block including a plurality of A/D converters according to one embodiment of the present invention. An A/D conversion block 10 includes a DLL (delayed lock loop) circuit 20 and a plurality of A/D converters 14-1, 14-2, . . . 14-n (hereinafter referred to as A/D converters 14 when they are not respectively identified, and n is a natural number) including a plurality of comparators 12-1, 12-2, . . . 12-n (hereinafter referred to as comparators 12 when they are not respectively identified, and n is a natural number) and a plurality of internal A/D converters 30-1, 30-2, . . . 30-n (hereinafter referred to as internal A/D converters 30 when they are not respectively identified, and n is a natural number).

The DLL circuit 20 includes a plurality of delay circuits 21-1, 21-2, 21-3, and 21-4 (hereinafter referred to as delay circuits 21 when they are not respectively identified), a phase detector (PD) 22, a charge pump (CP) and low-pass filter (LPF) 23. The delay circuits 21-1, 21-2, 21-3, and 21-4 at four stages arranged in series from the clock input terminal 11 have a clock signal inputted in series, and output in parallel multiphase clock signals 15 at different timings. To the delay circuit 21-1, a clock signal is inputted from the clock input terminal 11. To the delay circuit 21-2, an output from the delay circuit 21-1 is inputted. To the delay circuit 21-3, an output from the delay circuit 21-2 is inputted. To the delay circuit 21-4, an output from the delay circuit 21-3 is inputted. That is, the phase is shifted so that an output change at the previous stage is taken as an input at the next stage. Here, in the course of transmission of the input signal to the respective delay circuits 21, a delay by signal transmission poses a problem. Thus, the phase detector 22 is arranged in series to the delay circuits 21 and, furthermore, the charge pump and low-pass filter 23 is connected to the phase detector 22. The phase detector 22 and the charge pump and low-pass filter 23 control each delay circuit 21 so that the phase of the clock signal inputted from the clock input terminal 11 matches the phase of an output clock of each delay circuit 21. In this manner, the delay circuits 21-1, 21-2, 21-3, and 21-4 at four stages can form the multiphase clock signals 15 with an approximately same delay time and its phase equally divided with respect to the clock signal. The multiphase clock signals 15 outputted from the respective delay circuits 21 are inputted to the plurality of A/D converters 14 via buffers 16-1, 16-2, 16-3, and 16-4 (hereinafter referred to as buffers 16 when they are not respectively identified).

In the A/D converters 14, prior to the plurality of internal A/D converters 30, the plurality of comparators 12 respectively corresponding thereto are arranged. To each of the plurality of comparators 12, a pixel signal is inputted via a plurality of pixel signal input terminals 17-1, 17-2, . . . 17-n (hereinafter referred to as pixel signal input terminals 17 when they are not respectively identified, and n is a natural number) respectively corresponding thereto, and is compared with a reference voltage 18. As the reference voltage 18, a ramp wave monotonously decreasing or increasing is normally used. Therefore, at a timing in accordance with the voltage level of each pixel signal, a comparator output occurs from each comparator 12, and is subjected to A/D conversion in each internal A/D converter 30, allowing respective A/D conversion outputs 19-1, 19-2, . . . 19-n (hereinafter referred to as A/D conversion outputs 19 when they are not respectively identified, and n is a natural number) to be acquired.

Figure 15:
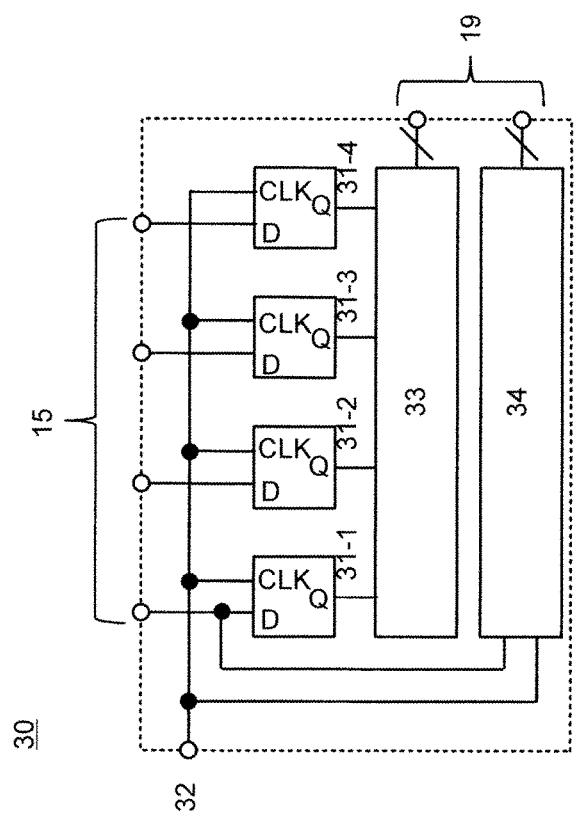
FIG. 15 is a circuit diagram of an A/D converter according to one embodiment of the present invention.

FIG. 15 shows the structure of the internal A/D converter 30. The internal A/D converter 30 includes a TDC unit and a counter unit. The TDC unit includes latches or flip-flops 31-1, 31-2, 31-3, and 31-4 (hereinafter referred to as latches or flip-flops 31 when they are not respectively identified). To an input terminal (D) of each latch or flip-flop 31, a multiphase clock signal 15 is inputted from each delay circuit 21 via each buffer 16. To a clock terminal (CLK) of each latch or flip-flop 31, a comparator output 32 is inputted in parallel from the comparator 12 corresponding to the internal A/D converter 30. The latch or flip-flop 31 latches a logic state of the multiphase clock signal 15 at a timing given by the comparator output 32. Each latch or flip-flop 31 is connected to a decoder 33. The latched logic state of the multiphase clock signal 15 is decoded at the decoder 33, and a binary output is outputted as a lower bit of the A/D conversion output 19. Also, the counter unit includes a ripple counter 34. To the ripple counter 34, the multiphase clock signal 15 and the comparator output 32 are inputted in parallel. The ripple counter 34 counts the number of clocks by operating a counter and stopping the operation with the comparator output 32, and the number of clocks is outputted as an upper bit of the A/D conversion output 19.

Mechanism and Effects of Second Embodiment

In each of the individual A/D converters 14 according to the second embodiment of the present invention, the delay circuit 21 and a delay control signal for controlling the delay circuit 21 are not present, thereby allowing reduction of the occupying area and reduction in degradation of A/D conversion accuracy. Also, power consumed at each latch at a rising edge of the clock is the same.
(Division of Time Domain Column A/D Converters and DLL for Each Time Domain A/D Conversion Block)

Figure 16:
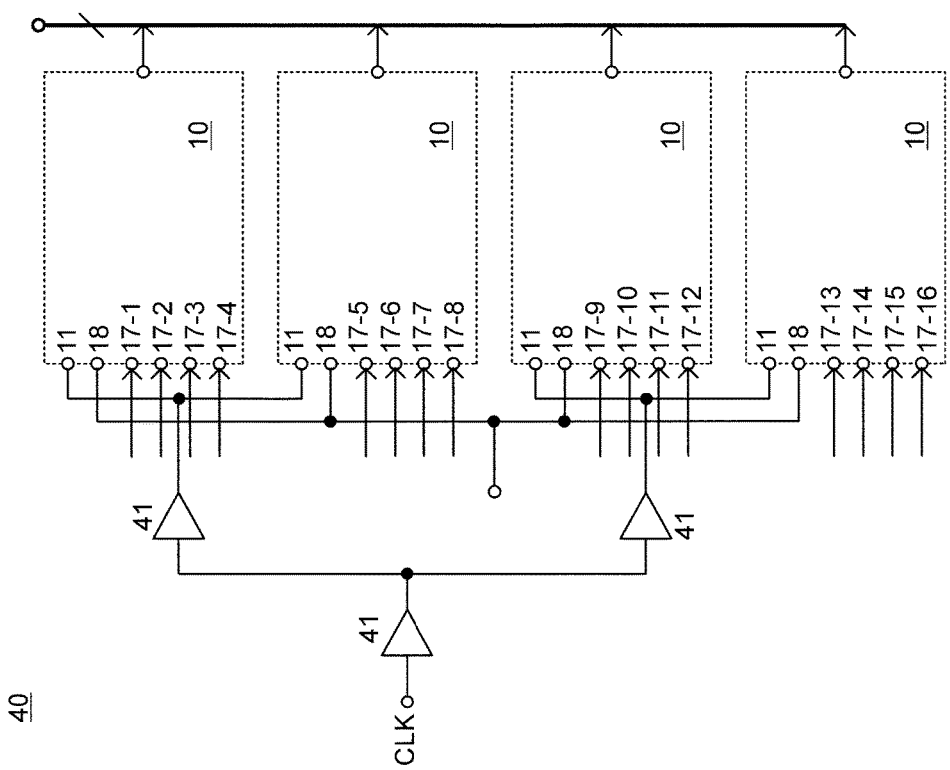
FIG. 16 is a circuit diagram of a column A/D converter according to one embodiment of the present invention.

FIG. 16 shows a column A/D converter in the second embodiment of the present invention. A column A/D converter 40 is required to perform A/D conversion simultaneously on pixel signals of several thousands of channels. It is not easy to supply a high-speed clock at the same timing and with less waveform degradation to many A/D converters 14 positionally distributed as described above. Thus, normally, a clock is driven in a tree shape via buffer, but power consumption is disadvantageously increased due to wiring and the capacitance of the buffer.

In the second embodiment of the present invention, many A/D converters 14 are divided into a plurality of A/D conversion blocks 10 (FIG. 14). The clock signal (CLK) is inputted in parallel to the clock input terminal 11 of each A/D conversion block 10 via a buffer 41. For each divided A/D conversion block 10, a multiphase clock signal 15 is generated from the clock signal (CLK) inputted to the clock input terminal 11 by using the DLL circuit 20, and is supplied to the plurality of A/D converters 14 in each A/D conversion block 10. In other words, the plurality of A/D converters 14 are organized for each A/D conversion block 10. For each organized A/D conversion block 10, the multiphase clock signal 15 is generated from the clock signal (CLK) inputted to the clock input terminal 11 using the DLL circuit 20, and is supplied to the plurality of A/D converters 14 in each A/D conversion block 10. Thus, in the column A/D converter 40 according to the second embodiment, each DLL circuit 20 in each A/D conversion block 10 converts a low-speed clock to a high-speed clock, and the clock frequency for driving the wiring and the buffer with large power consumption can be decreased, thereby allowing reduction in power consumption.

Mechanism and Effects of Second Embodiment

Also, as the clock wiring in each A/D conversion block 10, local wiring with less wiring capacitance per unit length can be used for wiring densification. Thus, even a small clock buffer in the A/D conversion block 10 is sufficient, and the wiring is also shortened, and therefore the wiring capacitance is decreased and power consumption can be reduced. That is, unlike a conventional CMOS image sensor in which a delay clock signal with a delay time equally divided with respect to the clock cycle is v at one location and is supplied to each A/D conversion circuit, as in the column A/D converter 40 according to the second embodiment shown in FIG. 14 to FIG. 16, the multiphase clock signals 15 are generated by using the plurality of DLL circuits 20 in a distributed manner, and are each supplied to the nearby A/D converter 14, thereby allowing far less power consumption. Also, in this structure, from the clock signal supplied to each A/D conversion block 10, the multiphase clock signal 15 with a delay time equally divided with respect to the cycle of the clock signal can be generated. Therefore, phase consistency between the clock supplied to the counter and the multiphase clock signal can be ensured, and timing errors occur less, thereby allowing A/D conversion characteristics with favorable differential nonlinearity to be acquired.

Figure 17:
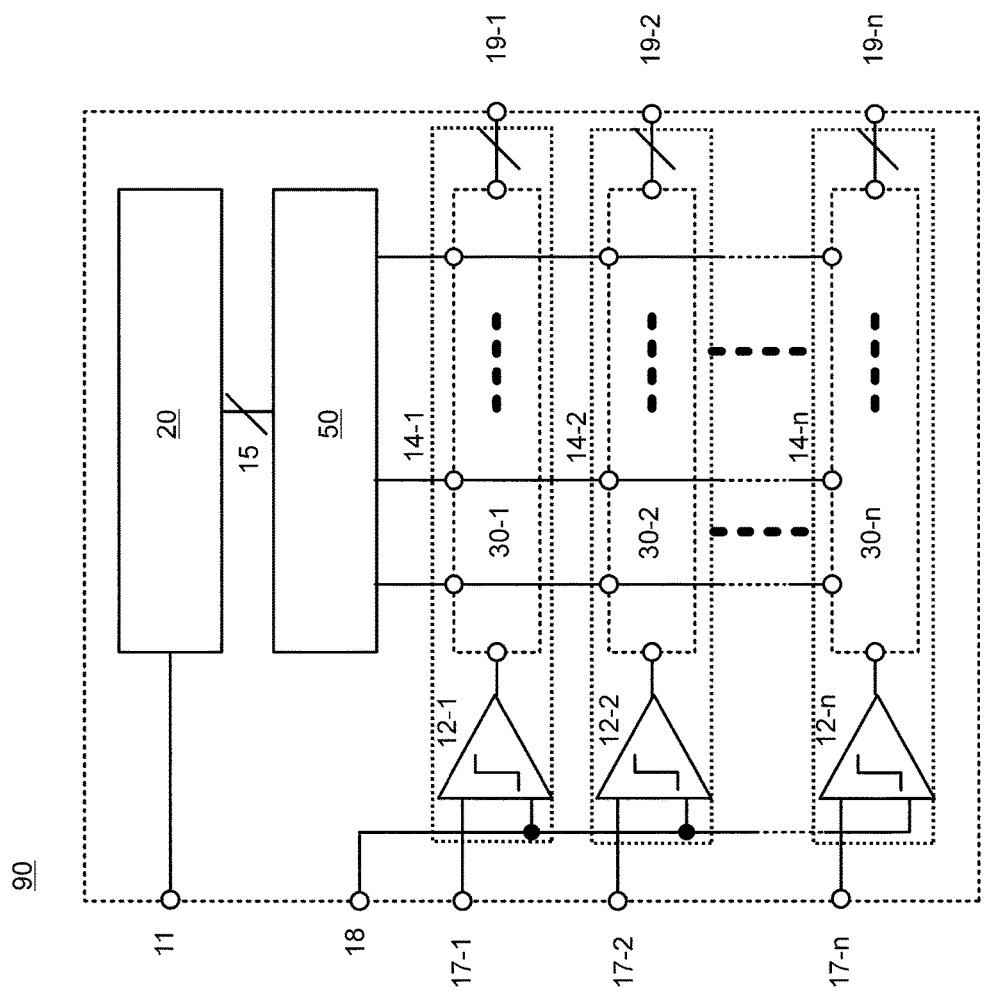
FIG. 17 is a circuit diagram of an A/D conversion block according to one embodiment of the present invention.

Third Embodiment (Conversion from Multi-Phase Clock Signal to Gray Code)
FIG. 17 shows an A/D conversion block according to a third embodiment of the present invention. An A/D conversion block 90 according to the third embodiment is identical to the A/D conversion block 10 according to the second embodiment except that a gray code converter 50 is further provided between the DLL circuit 20 and the internal A/D converter 30. Description identical to that of the second embodiment is omitted, and a portion different from the A/D conversion block 10 according to the second embodiment is described herein.

The multiphase clock signal 15 inputted from the DLL circuit 20 is converted at the gray code converter 50 from thermometer code to gray code, and is then inputted to the latch or flip-flop 31 configuring the TDC unit of each internal A/D converter 30. This structure can significantly decrease the number of latches configuring the TDC and reduce power consumption by half.
(Comparison Among Multi-Phase Clock Signal, Binary Code, and Gray Code)

Figures 18A, 18B, 18C:
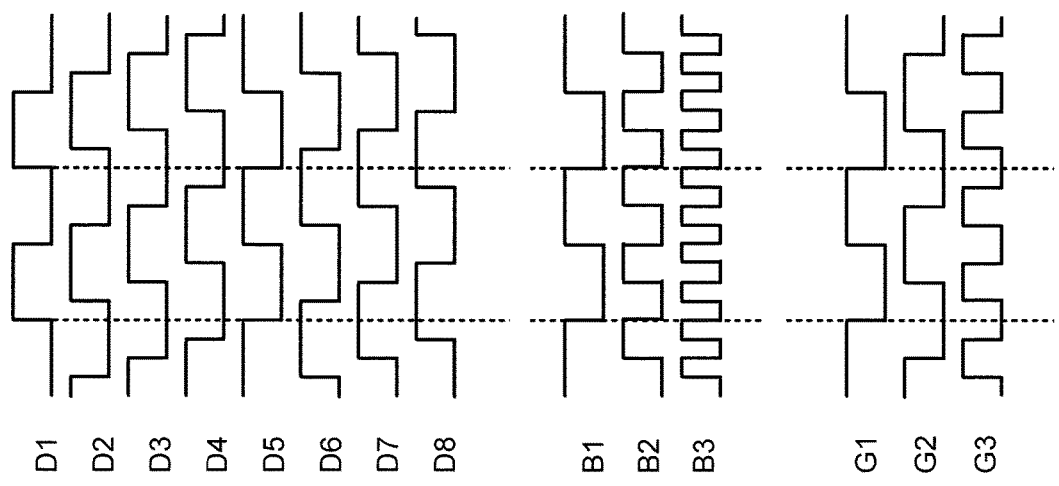
FIG. 18A shows clock waveforms of a TDC according to one embodiment of the present invention.
FIG. 18B shows clock waveforms of the TDC according to one embodiment of the present invention.
FIG. 18C shows clock waveforms of the TDC according to one embodiment of the present invention.

FIG. 18A shows a state of a clock of a TDC with resolution of three bits when a multiphase clock signal is used, FIG. 18B shows a state of a clock of the TDC when binary code is used, and FIG. 18C shows a state of a clock of the TDC when gray code is used. As shown in FIG. 18A, the number of latches $n_t$ and power consumption $p_t$ when a normal multiphase clock is used and the resolution is M bits can be represented by the following equation.

$$n_t = 2^M$$

$$p_t \propto 2^M \quad (5)$$

The number of latches $n_t$ exponentially increases with respect to the resolution M.

As shown in FIG. 18B, the number of latches $n_b$ and power consumption $p_b$ when a binary-code-like clock is generated from a multiphase clock and the resolution is M bits can be represented by the following equation.

$$n_b = M \quad (6)$$

$$p_b \propto \sum_{i=1}^{M} 2^{(M-i)}$$

The number of latches $n_b$ is the value of the resolution M.

Therefore, compared with the case in which a normal multiphase clock is used, the number of latches can be significantly reduced when a binary-code-lie clock is generated. Reduction in the number of latches is a great advantage for the column A/D converter whose occupying area is required to be small. However, it has been known that large error occur at a clock transition timing because the Hamming distance is long in binary code. The gray code, in which the Hamming distance is always 1, has extremely small errors and is stable.

As shown in FIG. 18C, when, the number of latches $n_g$ and power consumption $p_g$ when a gray-code-like clock is generated from a multiphase clock and the resolution is M bits can be represented by the following equation.

$$n_g = M \quad (7)$$

$$p_g \propto \sum_{i=2}^{M} 2^{(M-i)} + 1$$

The number of latches $n_g$ is equivalent to that of the binary code, that is, the value of the resolution, and thus the number of latches can be significantly reduced.

In FIG. 18A, power consumption is proportional to the number of transitions of the clock of one cycle from 0 to 1. In contrast to 7 in the binary code of FIG. 18B, the power consumption is 4 in the gray code of FIG. 18C, which is almost half of the power consumption in the binary code.

Figure 19A:
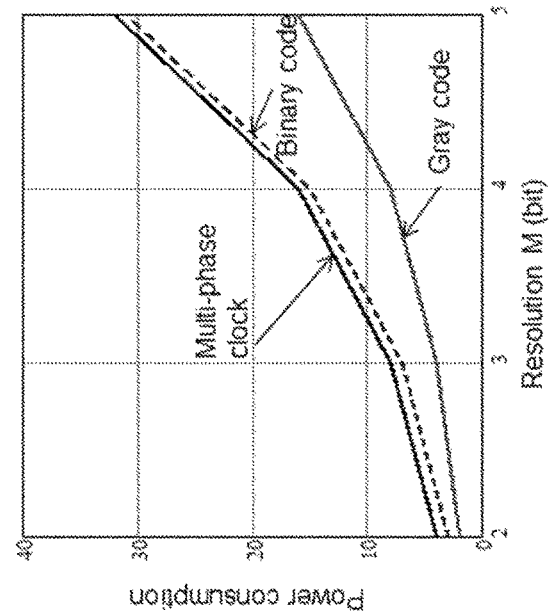
FIG. 19A is a diagram showing a relation between the number of latches and resolution of the TDC according to one embodiment of the present invention.
Figure 19B:
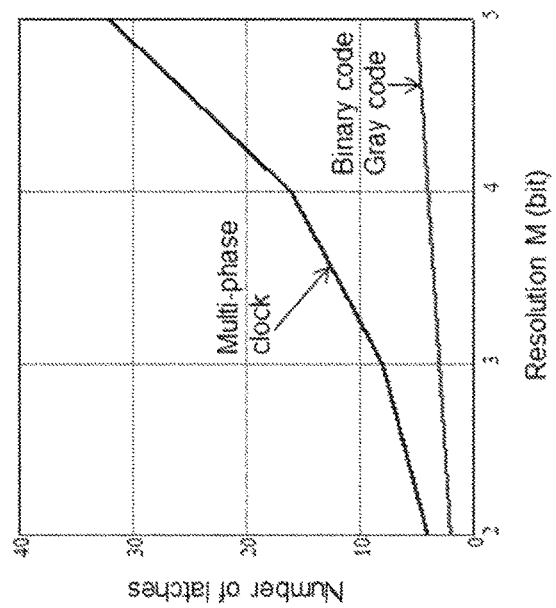
FIG. 19B is a diagram showing a relation between power consumption and resolution of the TDC according to one embodiment of the present invention.

FIG. 19A shows a relation between the number of latches and resolution and FIG. 19B shows a relation between power consumption and resolution, when the multiphase clock, the binary code, and the gray code are used and the resolution M is 2 to 5. As shown in FIG. 19A, only with the multiphase clock, the number of latches abruptly increases as the resolution increases, but hardly increases when the binary code or the gray code is used. As shown in FIG. 19B, there is almost no difference in power consumption between the multiphase clock and the binary code, and power consumption is approximately half of these when the gray code is used. Therefore, by using the gray code, it is possible to achieve a significant decrease in the number of latches and a decrease in power consumption by half. Also, stable conversion with extremely less errors such as glitches can be achieved.

As described above, by using the gray code, power consumption can be decreased compared with the conventional technology. By using the characteristics of a sensor signal, power consumption can be further reduced. When the time domain A/D converter group is used for A/D conversion of a sensor signal, the reference voltage is swept from a side where the sensor signal is weak (black level in the case of an image sensor) to a side where the sensor signal is strong (white level in the case of the image sensor). As described in detail by using FIG. 5 in the first embodiment, when the sensor signal is weak, the A/D converter requires high resolution. When the sensor signal is strong, the A/D converter does not require high resolution. For example, when the level of the sensor signal is up to a full scale of 0.05, resolution of 12 bits or more is required. When the level is higher, resolution on the order of 10 bits is sufficient. In the time domain A/D converter group, the number of clocks is exponentially proportional to resolution. Therefore, when the resolution is changed from 12 bits to 10 bits, the number of clocks of an A/D converter of 10 bit is ¼ of the number of clocks of an A/D converter of 12 bits, and power consumption can thus be made by approximately ¼.

Figure 20:
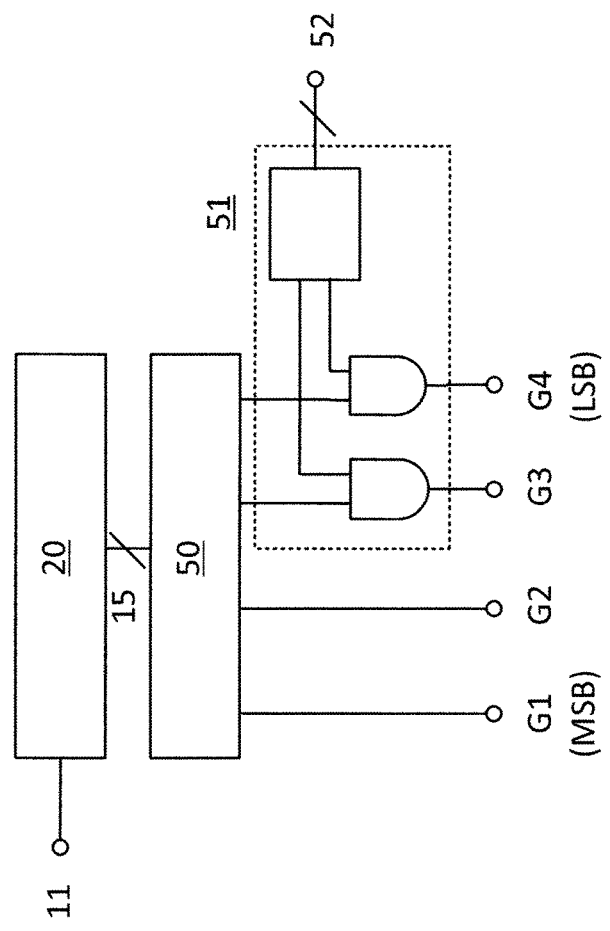
FIG. 20 is a gating circuit diagram for clocks of the TDC according to one embodiment of the present invention.
Figure 21:
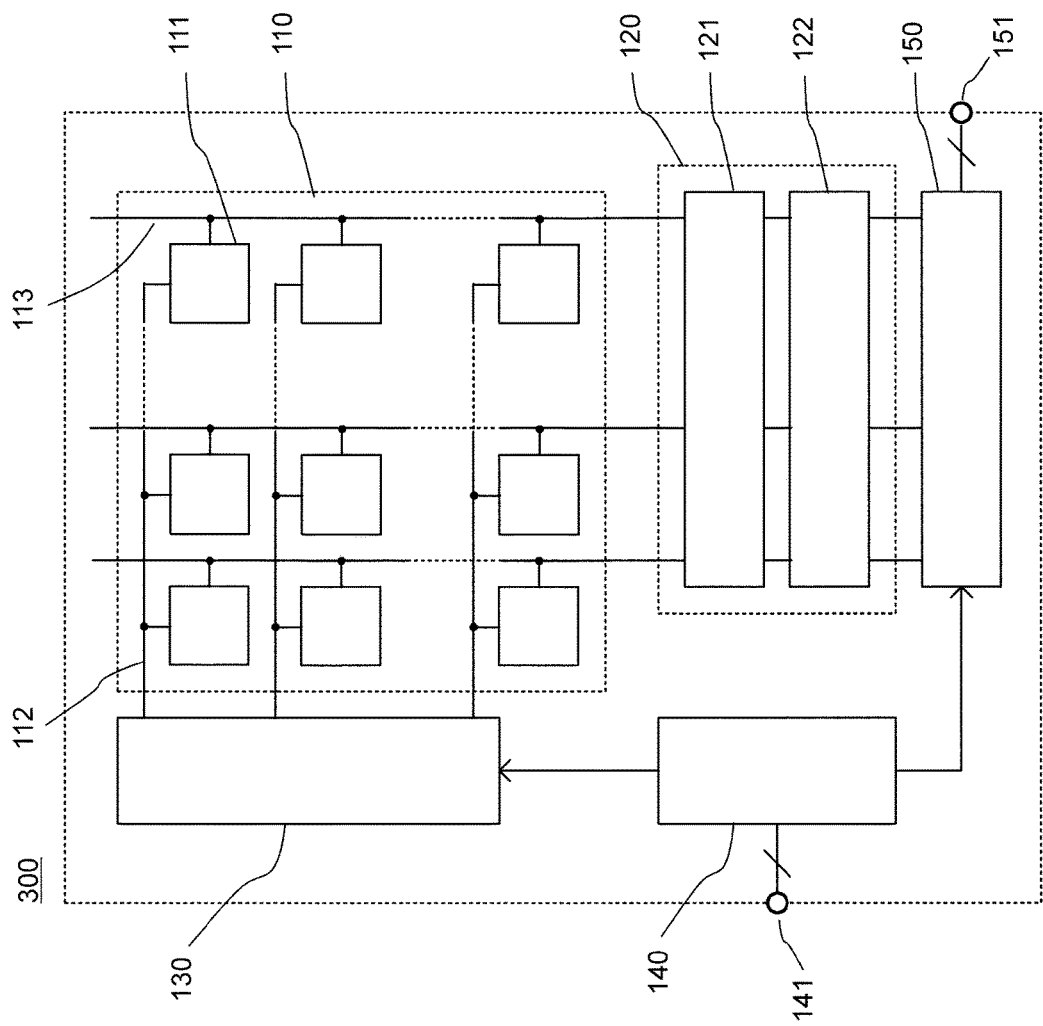
FIG. 21 is a circuit diagram of a conventional sensor device.
Figure 22:
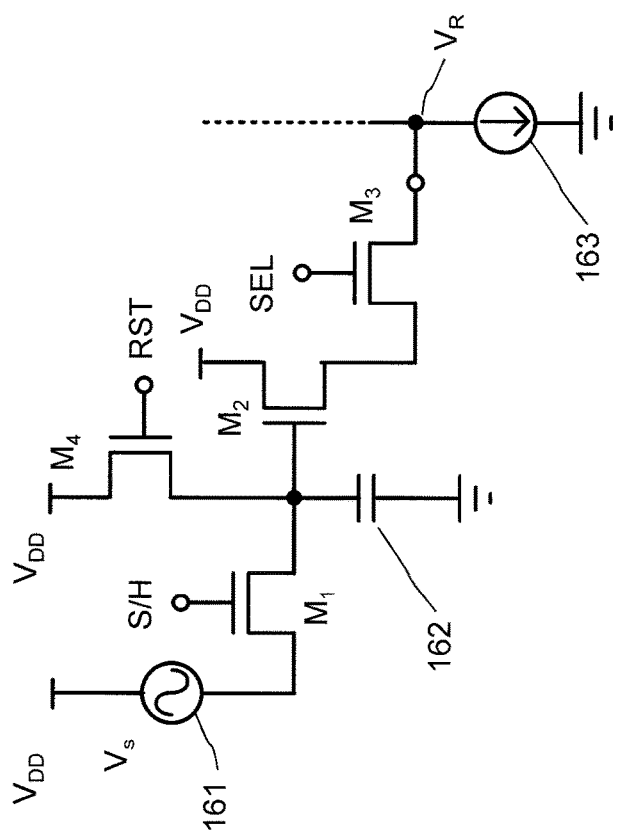
FIG. 22 is a circuit diagram of a unit sensor of the conventional sensor device.
Figure 23:
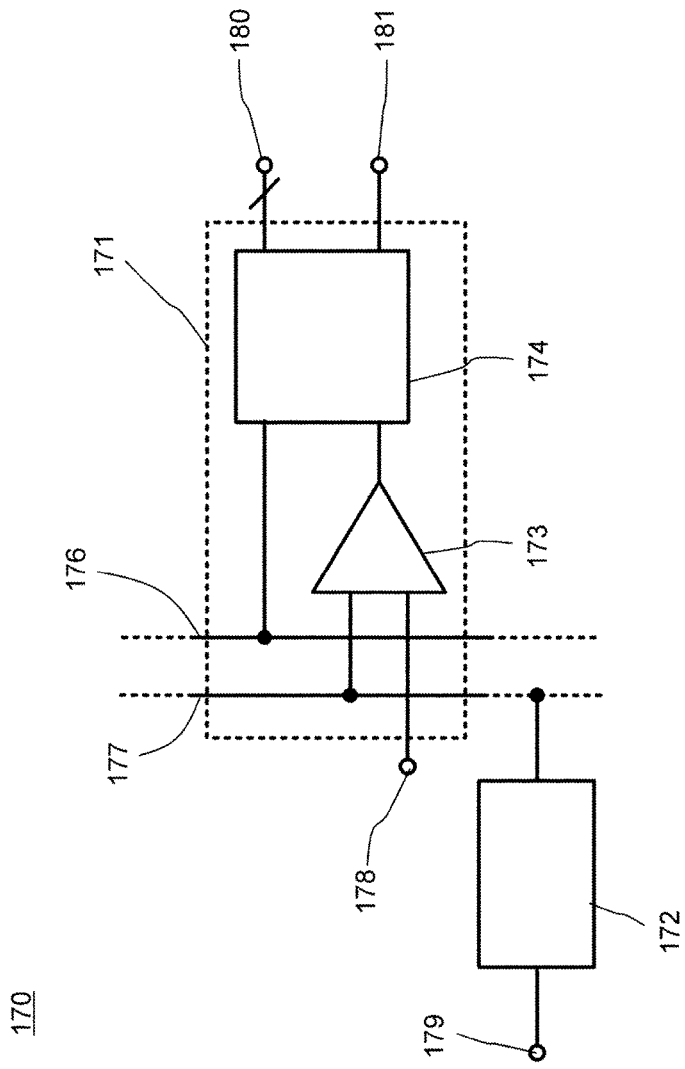
FIG. 23 is a circuit diagram of a slope A/D converter of the conventional sensor device.
Figure 24:
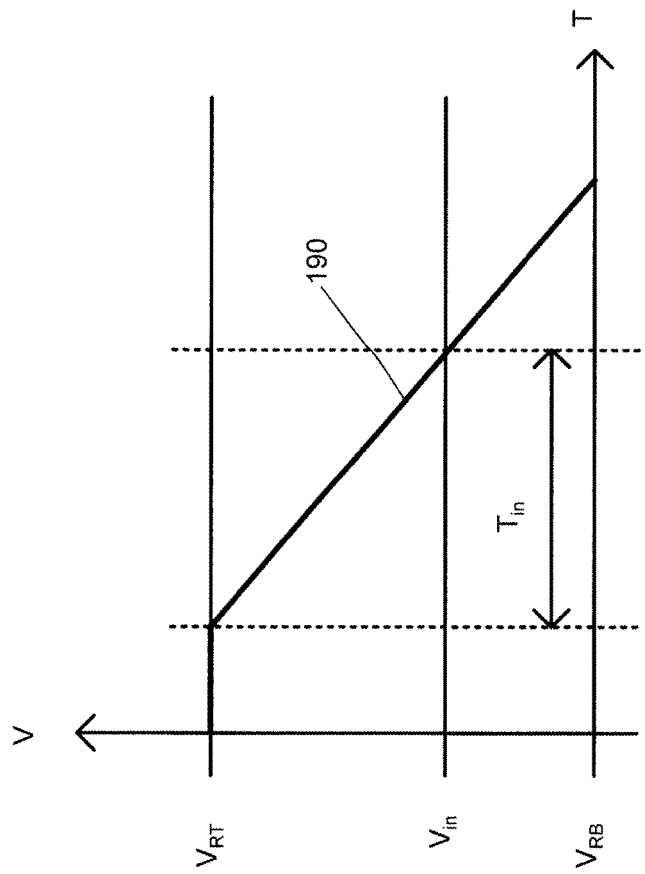
FIG. 24 is a diagram for describing operation of the slope A/D converter of the conventional sensor device.

Thus, as shown in FIG. 20, a gating circuit 51 may further be provided between the gray code converter 50 and the internal A/D converter 30. An output from the gray code converter 50 is inputted to the gating circuit 51. By controlling the output from the gray code converter 50 with a gating control signal 52, power consumption can be further decreased. For example, in the A/D converter of 12 bits, gating may not be performed until the level of the sensor signal is up to the full scale of 0.05, and gating may be performed on G4, which is a LSB (least significant bit), and G3 on the second bit when the level is equal to or higher than 0.05. As the signal level increases, the target bit may be sequentially increased to a MSB (most significant bit) side. By controlling the output from the gray code converter 50 in this manner, power consumption can be decreased by approximately ⅓ when A/D conversion is performed effectively with a resolution of 10 bits, compared with the case in which conversion is performed as it is with 12 bits.

The gating control signal 52 may be generated when the number of clocks after A/D conversion starts is measured by the counter and reaches a predetermined number. In this case, only one counter is enough in the entire chip. Therefore, an increase in power consumption due to the counter is at an almost negligible level. Also, the gating control signal 52 may be generated when an input signal of the D/A converter which generates a reference voltage reaches a predetermined value.

In the above description, a solid-state image pickup device such as a CMOS image sensor is taken as an example. However, the present invention is not only effective for a solid-state image pickup device but is also effective for and can be applied to a two-dimensional sensor device for another use purpose, a one-dimensional sensor device, or a single sensor device. The sensor is not limited to an image sensor, but is also effective for a temperature sensor, position sensor, torque sensor, speed sensor, acceleration sensor, pressure sensor, and so forth.

Furthermore, the sensor and the A/D conversion circuit may be integrated monolithically on an integrated circuit, or may be independently manufactured and then bonded together by packaging technology or the like.

It goes without saying that the A/D converter of the above-described embodiments not only can be coupled to the sensor but can be applied to any of various devices converting a received analog signal to a digital signal.

The embodiments described as embodiments of the present invention can be implemented as combined unless they are mutually contradictory to each other. Also, those provided, based on the A/D converter of the embodiments, by a person skilled in the art with addition, deletion, or design change of a component as appropriate and including the gist of the present invention are included in the scope of the present invention.

The present invention can be used for an increase in sensitivity, an increase in accuracy, power reduction, and an increase in speed of a sensor device, and is effective not only for an image sensor but also for a temperature sensor, position sensor, torque sensor, speed sensor, acceleration sensor, and pressure sensor.

What is claimed is:

1. A time domain analog-to-digital (A/D) converter group comprising:
    a plurality of A/D conversion blocks, wherein each of the A/D conversion blocks comprises:
        a delay locked loop circuit for dividing a cycle of a master clock that supplies a clock to an entire integrated circuit and outputting a multiphase clock with higher-speed and different timings;
        a logic circuit for synthesizing a plurality of clocks corresponding to gray code from the multiphase clock, and
        a plurality of A/D converters spatially adjacent to each other, wherein each of the plurality of A/D converters comprises:
            a comparator for comparing an input signal and a reference voltage to generate a comparison output signal, wherein the reference voltage changes monotonously with time, and
            an internal A/D converter comprising:
                a plurality of latches for holding a logic state of the plurality of clocks at a timing given by the comparison output signal; and
                a counter for counting a clock of a maximum width among the plurality of clocks and stop counting by the output of the comparator,
    wherein the delay locked loop circuit and the logic circuit are distributed in the entire integrated circuit and supply the plurality of clocks to the plurality of nearby A/D converters belonging to the same A/D converter blocks.

2. A time domain analog-to-digital (A/D) converter group comprising:
    a plurality of delay locked loop circuits for dividing a cycle of a master clock that supplies a clock to an entire integrated circuit and outputting a multiphase clock with different timings;
    a logic circuit for synthesizing a plurality of clocks corresponding to gray code from the multiphase clock;
    a plurality of comparators for comparing an input signal and a reference voltage;
    a plurality of internal A/D converters for obtaining A/D conversion values from a comparison output signals from the plurality of comparators; and
    a gating circuit for gating the plurality of clocks by a gating control signal,
    wherein the plurality of internal A/D converters perform A/D conversion using the multiphase clock, and
    wherein the gating is performed on a clock corresponding to a least significant bit (LSB) when a level of the input signal is low and a target bit is sequentially increased to a most significant bit (MSB) side when the level of the input signal increases.

3. A time domain analog-to-digital (A/D) converter group comprising:
    a plurality of delay locked loop circuits for dividing a cycle of a master clock that supplies a clock to an entire integrated circuit and outputting a multiphase clock with different timings;
    a logic circuit for synthesizing a plurality of clocks corresponding to gray code from the multiphase clock;
    a plurality of comparators for comparing an input signal and a reference voltage;
    a plurality of internal A/D converters for obtaining A/D conversion values from comparison output signals from the plurality of comparators; and
    a gating circuit for gating the plurality of clocks by a gating control signal,
    wherein the plurality of internal A/D converters perform A/D conversion using the multiphase clock, and
    wherein the gating control signal is generated when a number of clocks from a start of A/D conversion is measured and reached a predetermined number of times.

4. A time domain analog-to-digital (A/D) converter group comprising:
    a plurality of delay locked loop circuits for dividing a cycle of a master clock that supplies a clock to an entire integrated circuit and outputting a multiphase clock with different timings;
    a logic circuit for synthesizing a plurality of clocks corresponding to gray code from the multiphase clock;
    a plurality of comparators for comparing an input signal and a reference voltage;
    a plurality of internal A/D converters for obtaining A/D conversion values from a comparison output signals from the plurality of comparators; and
    a gating circuit for gating the plurality of clocks by a gating control signal,
    wherein the plurality of internal A/D converters perform A/D conversion using the multiphase clock, and
    wherein the gating control signal is generated when the input signal of a D/A converter which generates the reference voltage reaches a predetermined value.

* * * * *